United States Patent
Hsieh et al.

(10) Patent No.: US 6,949,203 B2
(45) Date of Patent: *Sep. 27, 2005

(54) SYSTEM LEVEL IN-SITU INTEGRATED DIELECTRIC ETCH PROCESS PARTICULARLY USEFUL FOR COPPER DUAL DAMASCENE

(75) Inventors: Chang-Lin Hsieh, San Jose, CA (US); Diana Xiaobing Ma, Saratoga, CA (US); Brian Sy Yuan Shieh, Palo Alto, CA (US); Gerald Zheyao Yin, San Jose, CA (US); Jennifer Sun, Sunnyvale, CA (US); Senh Thach, Union City, CA (US); Lee Luo, Fremont, CA (US); Claes H. Bjorkman, Mountain View, CA (US)

(73) Assignee: Applied Materials, Inc., Santa Clara, CA (US)

( * ) Notice: Subject to any disclaimer, the term of this patent is extended or adjusted under 35 U.S.C. 154(b) by 156 days.

This patent is subject to a terminal disclaimer.

(21) Appl. No.: 10/379,439

(22) Filed: Mar. 3, 2003

(65) Prior Publication Data

US 2003/0164354 A1 Sep. 4, 2003

Related U.S. Application Data

(63) Continuation-in-part of application No. 09/538,443, filed on Mar. 29, 2000, now Pat. No. 6,500,357.
(60) Provisional application No. 60/173,412, filed on Dec. 28, 1999, and provisional application No. 60/365,962, filed on Mar. 19, 2002.

(51) Int. Cl.$^7$ ................................................ H01L 21/00
(52) U.S. Cl. .................... 216/67; 216/41; 216/59; 216/79; 438/714; 438/715; 438/740
(58) Field of Search ..................... 216/41, 59, 67, 216/79; 438/724, 725, 732, 740, 714, 715

(56) References Cited

U.S. PATENT DOCUMENTS

| | | | |
|---|---|---|---|
| 4,842,683 A | 6/1989 | Cheng et al. | |
| 5,534,108 A | 7/1996 | Qian et al. | |
| 5,578,163 A | 11/1996 | Yachi | |
| 5,622,565 A | 4/1997 | Ye et al. | |
| 5,665,203 A | 9/1997 | Lee et al. | |
| 5,674,321 A | 10/1997 | Pu et al. | |
| 5,785,875 A | 7/1998 | Hawthorne et al. | |
| 5,811,357 A | 9/1998 | Armacost et al. | |
| 5,843,847 A * | 12/1998 | Pu et al. | 438/723 |
| 5,855,681 A | 1/1999 | Maydan et al. | |
| 5,902,704 A | 5/1999 | Schoenborn et al. | |
| 5,945,354 A * | 8/1999 | Mautz | 438/731 |
| 5,970,373 A | 10/1999 | Allen | |
| 5,980,768 A * | 11/1999 | Abraham | 216/67 |
| 6,069,091 A | 5/2000 | Chang et al. | |
| 6,176,667 B1 | 1/2001 | Fairbairn et al. | |
| 6,211,092 B1 | 4/2001 | Tang et al. | |
| 6,254,689 B1 | 7/2001 | Meder | |
| 6,296,988 B1 | 10/2001 | Lee | |
| 6,380,096 B2 | 4/2002 | Hung et al. | |
| 6,500,357 B1 * | 12/2002 | Luo et al. | 216/79 |
| 6,793,835 B2 * | 9/2004 | Luo et al. | 216/79 |
| 2001/0008226 A1 | 7/2001 | Hung et al. | |
| 2002/0022281 A1 | 2/2002 | Flanner et al. | |

FOREIGN PATENT DOCUMENTS

| | | |
|---|---|---|
| EP | 0709488 A1 | 5/1996 |
| EP | 1049133 A2 | 11/2000 |
| WO | WO 00/26954 A1 | 5/2000 |

OTHER PUBLICATIONS

R. Wu et al., "2–in–1 Total Process Integration in MERIE Etch.Chamber for Cu Dual Damscene Applications," 2000/IEEE/SEMI Advanced Semiconductor Manufacturing Conference, pp. 278–280 (2000).

P. Hsieh, "An Integrated Approach to Patterning Dual Damascene Structures in Low–k Materials," SEMICON Korea presentation, pp. 1–25 (Jan. 2002).

P. Hsieh, "The Challenges of Post Etch Treatment on Low–k Dual Damascene," NCCAVS Plasma Etch Users Group presentation, pp. 1–26 (Sep. 2001).

G. Hseuh et al., "An Integrated Etch, Strip, and Barrier Removal] Approach to Manufacturing Dual Damascene," NCCAVS Plasma Etch Users Group presentation, pp. 1–23 (Apr. 2001).

P. Hsieh et al., "An Integrated Etch Solution for Cu/Low–k Interconnects: Single Wafer Infancy to Production Level Maturity," 2001 International Interconnect Technology Conference, Hyatt Regency, San Francisco Airport Hotel, Burlingame, CA—Jun. 4–6, 2001, pp. 1–21 (Jun. 2001).

P. Hsieh et al., "eMAX Dual Damscene Etch: Capabilities on Low–k ILD," 2001 International Interconnect Technology Conference, Hyatt Regency, San Francisco Airport Hotel, Burlingame, CA—Jun. 4–6, 2001, pp. 1–13 (Jun. 2001).

SEMICON West presentation (Jul. 2001).

R. DeJule, "Dual Damascene: Overcoming Process Issues," *Semiconductor International, website* http://www.semiconductor.net, pp. 1–9 (Jun. 2000).

B. Guerra, "Developing a Modified ICP Process to Strip Resist Without Damaging Low–k Dielectric Film," Micromagazine.com, pp. 1–12 (Apr. 2001).

Q. Han et al., "Enabling Low–k Material Integration Through Low–ion Plasma Dry Strip Processes," Micromagazine.com, pp. 1–12 (Oct. 1999).

C.W. Kaanta et al., "Dual Damascene: A ULSI Wiring Technology," Jun. 11–12, 1991 *VMIC Conference, IEEE,* pp. 144–152 (Jun. 1991).

H. Shan et al., "M×P+: A New Dielectric Etcher With Enabling Technology, High Productivity, and Low Cost–of–Consumables," *J. Vac. Sci. Technol. B.,* vol. 14, No. 2, pp. 716–723 (Mar./Apr. 1996).

Lam Research, "Lam Research Corporation Releases Dual Damascene Applications for 4520XL$_E$™—Now in Uses in Copper Production at a Major U.S. Chip Manufacturer," *Lam Research Press Release from website* http://www.lam-rc.com/inside/news/releases/1998/f19980922.htm, pp. 1–2 (Sep. 1998).

Z. Sui et al., "Integrated Process Control Using An In–Situ Sensor for Etch," *Solid State Technology* (Apr. 2002).

Nanometrics, Integrated Metrology™ Presentation (Jan. 2001).

Z. Sui et al., "Innovative In–situ Sensor Process Control for Next–Generation Dual Damscene Trench Etch and Spacer Etch Applications," pp. 1–4 (Nov. 2001–unknown if published).

Hung et al., U.S. Appl. No. 09/112,094; filed Jul. 9, 1998.
Hung et al., U.S. Appl. No. 09/149,810; filed Sep. 8, 1998.
Sun et al., U.S. Appl. No. 09/918,683; filed Jul. 27, 2001.
Lin et al., U.S. Appl. No. 10/071,869; filed Feb. 8, 2002.
Lin et al., U.S. Appl. No. 10/137,782; filed May 3, 2002.

\* cited by examiner

*Primary Examiner*—Shamim Ahmed
(74) *Attorney, Agent, or Firm*—Townsend and Townsend and Crew; Joseph Baoh

(57) ABSTRACT

An integrated in situ etch process performed in a multichamber substrate processing system having first and second etching chambers. In one embodiment the first chamber includes an interior surface that has been roughened to at least 100 $R_a$ and the second chamber includes an interior surface that has a roughness of less than about 32 $R_a$. The process includes transferring a substrate having formed thereon in a downward direction a patterned photoresist mask, a dielectric layer, a barrier layer and a feature in the substrate to be contacted into the first chamber where the dielectric layer is etched in a process that encourages polymer formation over the roughened interior surface of the chamber. The substrate is then transferred from the first chamber to the second chamber under vacuum conditions and, in the second chamber, is exposed to a reactive plasma such as oxygen to strip away the photoresist mask deposited over the substrate. After the photoresist mask is stripped, the barrier layer is etched through to the feature to be contacted in the second chamber of the multichamber substrate processing system using a process that discourages polymer formation over the relatively smooth interior surface of the second chamber. All three etching steps are performed in a system level in situ process so that the substrate is not exposed to an ambient between steps. In some embodiments the interior surface of the first chamber has a roughness between 100 and 200 $R_a$ and in other embodiments the roughness of the first chamber's interior surface is between 110 and 160 $R_a$.

46 Claims, 9 Drawing Sheets

| Increasing | BD ER | PR Sel | u-loading | Non-Unif. | U-trench |
|---|---|---|---|---|---|
| CF4 | ↑ | ↓ | ↑ | ------ | ------ |
| N2 | ↑ | ------ | ↑ | ------ | ------ |
| Ar | ↓ | ------ | ↓ | ------ | ↑ |
| CO | ↓ | ↑ | ↓ | ------ | ------ |
| O2 | ↑ | ------ | ↓ | | |
| CHF3 | ↑ | ↓ | | | |
| Pressure | ↑ | ↑ | ↑ | Edge fast | ↓↓ |
| Power | ↑↑ | ↑ | ↑ | ↓ | ↑↑ |
| B-Field | ↑ | ↑ | ------ | Edge fast | ------ |

*FIG. 7*

| | | BD-I ER | PR sel. | Non-UN | u-loading | Striations |
|---|---|---|---|---|---|---|
| 1000 <1500/800 | Power | ▲ | ▲▲▲ | ▼ | ------ | ▲ | ▲▲ |
| 100 <150/75 | Pressure▲ | ▲▼▼▼ | ------ | ▼ | ▼ | ▲ |
| 1000 <1200/800 | Ar | ▲ | ▲ | ------ | ▼ | ▼ | ------ |
| 0 ~ 5 | O2 | ▲ | ▲ | ▼ | ------ | ▼ | ▼ |
| 500/100 | CO (w/o Ar) | ▲ | ▲ | ▲▲ | ------ | ▲▲ | ▼ |

*FIG. 8*

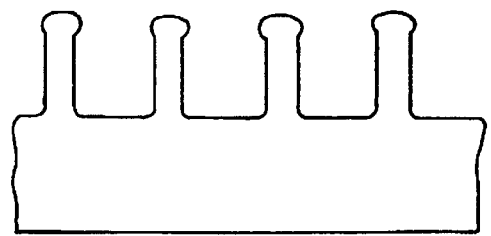
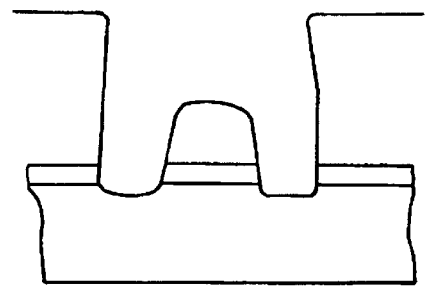
FIG. 9A  FIG. 9B
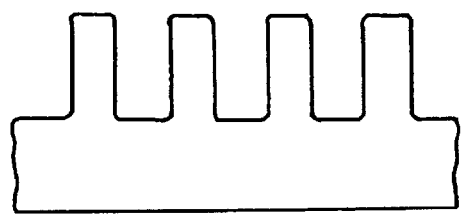
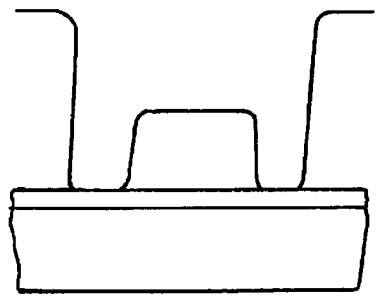
FIG. 10A  FIG. 10B

SYSTEM LEVEL IN-SITU INTEGRATED DIELECTRIC ETCH PROCESS PARTICULARLY USEFUL FOR COPPER DUAL DAMASCENE

CROSS REFERENCE TO RELATED APPLICATIONS

This application is a continuation-in-part of U.S. application Ser. No. 09/538,443, filed Mar. 29, 2000, now U.S. Pat. No. 6,500,357 which claims priority from U.S. Provisional Application No. 60/173,412, filed Dec. 28, 1999. This application also claims the benefit of U.S. Provisional Application No. 60/365,962, filed Mar. 19, 2002. The Ser. Nos. 09/538,443; 60/173,412 and 60/365,962 applications are incorporated herein by reference.

BACKGROUND OF THE INVENTION

The present invention relates to plasma etch processes used in the manufacture of semiconductor integrated circuits. More specifically, the present invention relates to a system level in situ integrated process for etching layered dielectric structures serving as inter-level dielectric layers.

The technology of fabricating semiconductor integrated circuits continues to advance in the number of transistors, capacitors and other electronic devices that can be fabricated on a single integrated circuit chip. This increasing level of integration is being accomplished in large part by decreasing the minimum feature sizes of the integrated circuits. The increasing level of integration has also resulted in an increase in the number of layers that make up the integrated circuit. Even as the number of layers in the integrated circuit continues to increase, advanced processes are being developed which allow for a reduction in the number of processing steps for a functional layer. However, these advanced processes often make extraordinary demands upon the chemistry of the etching process. Dielectric etching has presented some of the most difficult demands.

In the past, one common material for inter-level dielectric materials in integrated circuits was undoped silicon dioxide, which has a dielectric constant (k) generally between about 3.9–4.2. In recent years, semiconductor manufacturers have instead been using materials for inter-level insulation layers that have a dielectric constant below that of silicon dioxide. Two such materials that are now commonly used include fluorine-doped silica glass (FSG), which has a k value generally between about 3.4–3.7 and carbon-doped silica glass (SiOC films) which has a k value between about 2.5 and 3.1.

Concurrent with the move to intermetal dielectric layers having a dielectric constant lower than silicon dioxide, many semiconductor manufacturers are using copper rather than aluminum in the formation of their multilevel interconnect structures. Because copper is difficult to etch in a precise pattern, however, the traditional deposition/selective etch process used for forming such interconnects has become disfavored. Accordingly, a process referred to as a dual damascene process, is used by many semiconductor manufacturers to form copper interconnects. In a dual damascene process, one or more blanket intermetal dielectric layers are deposited and then subsequently patterned and etched to define both the interlayer vias and the interconnect lines. Copper or another conductive material is then inlaid into the defined pattern and any excess conductive material is removed from the top of the structure in a planarization process, such as a chemical mechanical polishing (CMP) process.

The etching of the dielectric layer in such a dual damascene process typically includes two separate lithography steps. One step defines the trenches and another the vias. One particular type of dual damascene structure, illustrated in sectioned isometric view, is shown in FIG. 1.

As shown in FIG. 1, a substrate 10 includes a conductive feature 11 in its surface. If substrate 10 already includes a wiring level at its surface, the conductive feature 11 is metallic and may be a previously formed dual damascene metalization. The interconnection between two metallic wiring levels is called a via. Conventionally, the metal forming the metalization has been aluminum and its alloys or tungsten, but many advanced integrated circuits are now being designed with copper metalization. Alternatively, conductive feature 11 may be a doped region in silicon substrate 10, for example, a source or drain. In this case, the interconnection between the silicon layer and a first metalization layer is called a contact. Although the method and technique of the present invention may be beneficially applied to the formation of contacts, the invention is believed to be particularly useful in the formation of vias, particularly copper vias and underlying copper lines 11.

A lower stop layer 12 (sometimes referred to as a barrier layer when deposited over metalization), a lower dielectric layer 14, a middle stop layer 16, and an upper dielectric layer 20 are deposited over substrate 10 and included conductive feature 11. Stop layers 12, 16 have compositions relative to those of dielectric layers 14, 20 such that an etch chemistry is available which effectively etches a vertical hole in the overlying dielectric layer 14, 20 but stops on the stop layer 12, 16. That is, the etch selectively etches the dielectric layer over the stop layer. Alternatively stated, the dielectric etch is selective to the stop material. As mentioned before, more advanced circuits are being designed with the two dielectric layers 14, 20 being composed of a dielectric material having a lower dielectric constant than that of silicon dioxide, such as carbon-doped silica glass. Accordingly, the specific example of the damascene structure described here uses Black Diamond™, which is an SiOC material (sometimes referred to as an SiCOH material), developed by Applied Materials the assignee of the present invention, as the via and trench dielectric layers. Two typical stop or barrier materials for Black Diamond™ are either a silicon carbide (SiC or SiCN) material, such as BloK™ also developed by Applied Materials or silicon nitride (SiN). Black Diamond™ and BloK™ are each trademarks of Applied Materials, the assignee of the present invention.

Black Diamond™ and BloK™ can be grown in successive steps in a single reactor or in separate chambers of the same multichamber system by plasma-enhanced chemical vapor deposition (PECVD) techniques. For example, Black Diamond™ can be grown using PECVD techniques using trimethylsilane (TMS) and molecular oxygen as the process gas. BloK™ can be grown in the same reactor using tetramethylcyclotetrasiloxane (TMCTS) as the silica precursor in the presence of a helium carrier gas. One advantage of BloK™ as a stop and/or barrier layer as opposed to silicon nitride is that BloK™ has a lower k value than silicon nitride. These examples are non-limiting and simply show one advantage of the illustrated vertical structure.

The dual damascene etch structure shown in FIG. 1 is formed in the previously described vertical structure. FIG. 2 is a flowchart illustrating one processing sequence that can be performed to etch the dual damascene structure shown in FIG. 1. As shown in FIG. 2, after all the dual damascene layers 12, 14, 16, 20 are grown in a horizontally unpatterned vertical structure (step 74), a first photoresist layer is deposited over trench dielectric layer 20 and patterned with apertures corresponding to the via holes 18 (step 76). Next, an extended via hole is etched from the top of trench dielectric layer 20 to the top of barrier layer 12 using a multistep etch process that must etch very deeply. This step may etch a very narrow hole (e.g., a hole having a width of 0.1 or 0.13 µm and an aspect ratio of greater than 10:1 for contact etching and between about 4–6:1 for typical inter-level dual damascene applications). This multistep etch process (step 78) is rather demanding and must take the possibility of etch stop into consideration. (Etch stop arises from the fact that the high selectivity of fluorocarbon-based oxide etches to underlying silicon or BloK™ as well as verticality of the sidewalls depend upon a polymer depositing on non-oxide surfaces and on the sidewalls. However, if the etching chemistry is too rich, favoring too much polymer formation, the polymer may bridge the sidewalls and cover the oxide bottom of the developing hole thereby preventing further etching.) Earlier steps in this multistep etch process must etch through both the upper trench dielectric layer and the upper BloK™ etch stop layer while the final step of the process requires good selectivity to underlying lower BloK™ barrier layer 12.

At the completion of multistep etch 78, the first photoresist layer is stripped and a new photoresist layer (not shown in FIG. 1) is deposited over the top of the trench dielectric layer 30 and patterned to the area of the trench 22 (step 80). Next, in a trench etch step (step 82), trench dielectric layer 20 is etched down to middle BloK™ stop layer 16, thereby forming trench 22. After trench etch 82, the photoresist layer is stripped (step 84) in a process that also removes any polymer produced during trench etch 82. Stripping the photoresist in step 84 is sometimes referred to as ashing. Finally, lower BloK™ barrier layer 12, which lies exposed at the bottom of via hole 18, is removed to expose contact or metal layer 11 (step 86).

The result of the above process is that a generally circular via hole 18 is etched through the via dielectric layer 14 and the lower BloK™ barrier layer 12 to reach the underlying conductive feature 11. Multiple such via holes 18 are etched to reach different ones of the conductive features 11. Trench 22 extends along the surface of substrate 10 and is etched through trench dielectric layer 20 and middle BloK™ stop layer 16.

After completion of this dual damascene etch structure, trench 22 and vias 18 are filled with a metal such as copper. One common technique used to fill trench 22 and via 18 with copper is electroplating. Copper may also be deposited in the trench and via areas using a physical vapor deposition (PVD) process, a chemical vapor deposition (CVD) process and/or electroless plating, however. Barrier layers are usually first conformally coated in the hole being filled. A typical barrier for copper includes Ta/TaN. The metal is deposited to a thickness that overfills the trench 22 and also covers a top planar surface 30 of the upper oxide layer 30. Chemical mechanical polishing (CMP) is applied to the top surface of the wafer. CMP removes the relatively soft exposed metal but stops on the relatively hard dielectric layer 20. The result is a horizontal metal interconnect within the trench 22 and multiple vertical metal interconnects (vias) in the via holes 18.

As can be appreciated by those of skill in the art, the dual damascene etch process described above requires differing etch chemistries and etch capabilities for the steps used to etch through the trench dielectric layer, strip the photoresist and etch through the barrier layer (steps 82, 84, 86). Because of the different demands such processes place on substrate etching equipment and limitations in the equipment itself, many integrated circuit (IC) fabrication facilities employ separate pieces of equipment or systems within the fab to perform each step of the above described oxide etch sequence. Such an arrangement of equipment provides for an ex situ etch process because substrates must be transferred within the clean room between the various pieces of equipment. Exposure of the wafers to the air environment during the transfer between vacuum chambers may result in corrosion of the metal features of the partially processed integrated circuit. The well known susceptibility of copper to corrosion in air increases the destructive risk. Also, carbon-based residue that forms on the interior of the reactor chamber over time can redeposit on exposed copper surfaces. Since these carbon based residues can be extremely difficult to remove from copper, their presence can adversely impact upon subsequent formation of electrical contacts to the copper.

Furthermore, such an ex situ process may result in the formation of a polymer at the bottom of the contact or via area 18 that is not easily etched in stop layer open step 86. Thus, many integrated circuit manufactures that employ an ex situ process for steps 82, 84, 86 further perform a wet solvent etch by, e.g., dipping the substrate in an HF solution, between photoresist strip step 84 and stop layer open step 86.

Engineers at Applied Materials, the assignee of the present invention, have developed an integrated dielectric etch process that can be implemented in a single etch chamber thus eliminating the problems associated with exposing the substrate to the ambient during the etch process. One version of this single chamber etch process is described in U.S. application Ser. No. 09/201,590 referred to above. The process described in the Ser. No. 09/201,590 application provides an improvement in both etching results and cost of ownership as compared to previously known ex situ dielectric etch processes. The process also can be satisfactorily used to form dual damascene structures without requiring a wet solvent dip between the photoresist strip and stop layer open steps.

The dual damascene dielectric trench and via etch steps are expected to be some of the primary steps in the fabrication of future advanced integrated circuits. Industry sources predict that the market for these dielectric etch solutions is one of the largest, if not the largest, markets for equipment substrate processing manufacturers. Thus, while the all-in-one single chamber in situ dielectric etch solution described in the above patent application provides a distinct improvement over ex situ processes, alternative methods of performing the dielectric etch steps are desirable.

SUMMARY OF THE INVENTION

The present invention provides a system level in situ method of performing the dielectric etch process, such as the three step trench etch sequence of steps 82, 84, 86 (dielectric etch, photoresist strip, stop/barrier layer open) shown in FIG. 2. Embodiments of the invention employ two different chambers in a multichamber substrate processing system in order to perform such a three step etch sequence. The method transfers the substrate to be processed between the two chambers in the multichamber system under vacuum conditions so as to not expose the substrate to an ambient between the various steps of the etch sequence.

The inventors have found that such a two chamber in situ approach has a reduced cost of ownership as compared to either previously known ex situ systems or single chamber in situ systems. The inventors have also found that such a two chamber in situ approach provides improved etch results as compared to a single, all-in-one chamber approach when the dielectric material to be etched in the dielectric etch step is a silicon oxide material such as a carbon-doped silica glass (SiOC) film, a fluorine-doped silica glass (SiOF) film or other film that is etched with a fluorine-based chemistry.

In one embodiment the method of the present invention is an integrated etch process performed in a multichamber substrate processing system having first and second chambers. The process includes transferring a substrate having formed thereon in a downward direction a patterned photoresist mask, a dielectric layer, a barrier layer and a feature in the substrate to be contacted into the first chamber where the dielectric layer is etched in a process that encourages polymer formation over an interior surface of the first chamber. The substrate is then transferred from the first chamber to the second chamber under vacuum conditions and, in the second chamber, is exposed to a reactive plasma, such as an oxygen plasma, to strip away the photoresist mask deposited over the substrate. After the photoresist mask is stripped, the barrier layer is etched through to the feature to be contacted in the second chamber of the multichamber substrate processing system using a process that discourages polymer formation over an interior surface of the second chamber. All three etching steps are performed in a system level in situ process so that the substrate is not exposed to an ambient between steps. In some specific embodiments the interior surface of the first chamber is cooled during the first etch step to promote polymer formation on the surface, and the temperature of the interior surface of the second chamber is controlled during the second etch step to minimize polymer formation.

In another embodiment the method of the present invention is an integrated etch process performed in a multichamber substrate processing system having first and second chambers where the first chamber includes an interior surface that has a first roughness and the second chamber includes an interior surface that has a second roughness that is less than the first roughness. The process includes transferring a substrate having formed thereon in a downward direction a patterned photoresist mask, a dielectric layer, a barrier layer and a feature in the substrate to be contacted into the first chamber where the dielectric layer is etched in a process that encourages polymer formation over the roughened interior surface of the chamber. The substrate is then transferred from the first chamber to the second chamber under vacuum conditions and, in the second chamber, is exposed to a reactive plasma, such as an oxygen plasma, to strip away the photoresist mask deposited over the substrate. After the photoresist mask is stripped, the barrier layer is etched through to the feature to be contacted in the second chamber of the multichamber substrate processing system using a process that discourages polymer formation over the relatively smooth interior surface of the second chamber. All three etching steps are performed in a system level in situ process so that the substrate is not exposed to an ambient between steps. In some embodiments the interior surface of the first chamber has a roughness between 100 and 200 $R_a$ and in other embodiments the roughness of the first chamber's interior surface is between 100 and 140 $R_a$. In some embodiments the roughness of the interior surface of the second chamber is less than or equal to 32 $R_a$.

In some embodiments the dielectric layer etched in the first chamber is either a carbon-doped silica glass layer or a fluorsilicate glass layer. Also, in some embodiments the stop layer is selected from the group consisting of a silicon nitride layer or a silicon carbide (e.g., SiC or SiCN) layer. Still further embodiments of the invention etch the dielectric layer in the first chamber with a plasma formed from a fluorocarbon gas.

These and other embodiments of the present invention, as well as its advantages and features, are described in more detail in conjunction with the text below and attached figures.

BRIEF DESCRIPTION OF THE DRAWINGS

FIG. 7 is a chart depicting the major process trends for the main etch portion of the dielectric etch step according to one embodiment of the present invention;

FIG. 8 is a chart depicting the major process trends for the main etch portion of the dielectric etch step according to another embodiment of the present invention;

FIGS. 9A–9B are simplified illustrations representing a cross-sectional view of structures etched into a substrate using techniques according to a previously known, all-in-one chamber process;

FIGS. 10A–10B are simplified illustrations representing a cross-sectional view of structures etched into a substrate using techniques according to an embodiment of the present invention.

DESCRIPTION OF THE SPECIFIC EMBODIMENTS

I. INTRODUCTION

Figures 1, 2:
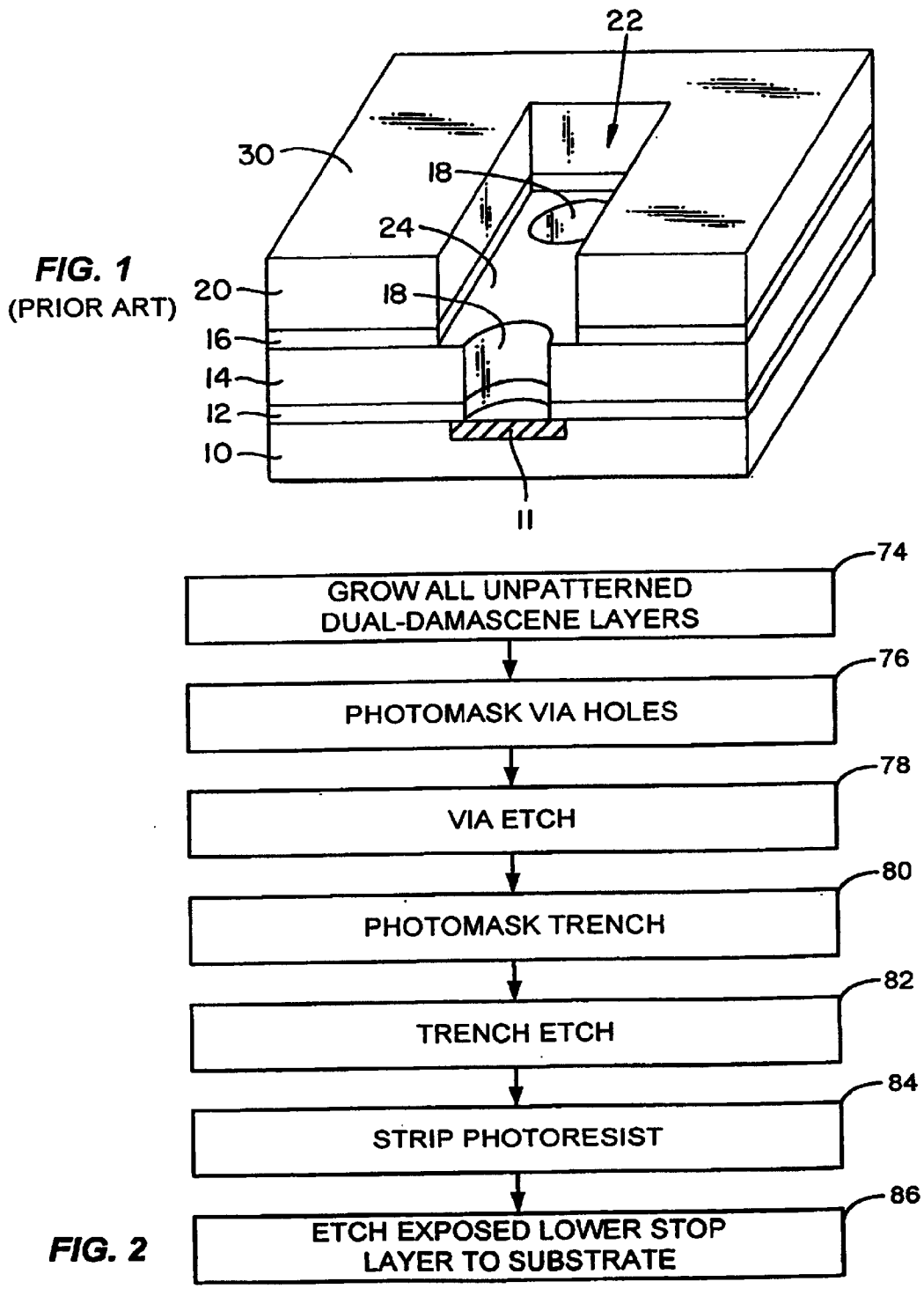
FIG. 1 is a sectioned isometric view of a dual damascene structure for which the method of the present invention may be used to form.
FIG. 2 is a flowchart illustrating one processing sequence that can be performed to etch the dual damascene structure shown in FIG. 1.
Figure 3:
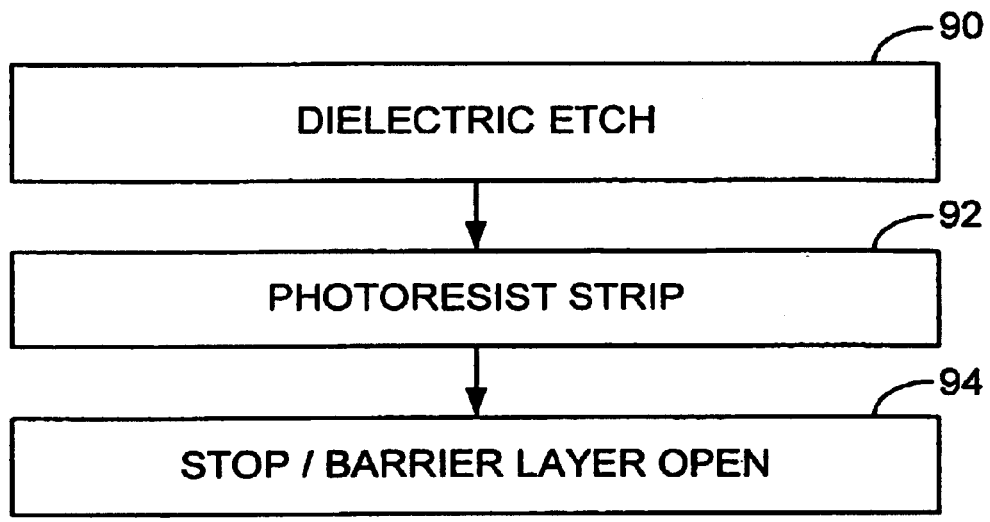
FIG. 3 is a flowchart that shows the three primary steps of the dielectric etch sequence according to embodiments of the present invention.

FIG. 3 is a flowchart that shows the three primary steps of the dielectric etch sequence according to embodiments of the present invention. As shown in FIG. 3, the dielectric etch sequence, which is expected to be one of the most common sequence of steps used by integrated circuit manufacturers to produce future integrated circuits, includes a dielectric etch step 90, a photoresist strip step 92 and a stop layer open step 94. Steps 90, 92 and 94 are used in the formation of vias in standard integrated circuit manufacturing techniques and in single damascene and dual damascene processes.

Recognizing the importance of the dielectric etch sequence to the semiconductor industry, the inventors of parent application U.S. Ser. No. 09/538,443 undertook a detailed analysis of the cost of ownership of a variety of approaches used to perform the process. This analysis concluded that a system-level in situ approach that used two separate chambers in a multichamber system that transferred substrates between chambers under vacuum conditions presented significant cost of ownership benefits over either a multiple chamber ex situ approach or a single, all-in-one chamber approach. As used herein, an "all-in-one" chamber approach refers to the dielectric etch, photoresist strip and stop layer open steps all being performed in a single chamber in an in situ process.

The present inventors further discovered significant performance benefits as compared to an all-in-one chamber approach when the two chamber approach included a first chamber to perform the silicon oxide (including FSG and carbon-doped silica glass films) dielectric etch step and a second chamber to perform the photoresist strip and stop layer open steps. A fluorine-containing polymer accumulates on the interior surfaces of the walls of the chamber used to etch the silicon oxide-based dielectric material during dielectric etch step 90. When an all-in-one chamber approach is used, the inventors have found that during the subsequent oxygen stripping process, oxygen may react with and release fluorine from this polymer, which in turn, has an undesirable isotropic etching effect on the dielectric layer. This isotropic etching effect may result in an overetching of the dielectric layer including the loss of critical dimensions. The inventors refer to this undesirable effect associated with the release of fluorine during the oxygen stripping process as the "fluorine memory effect."

It is possible to eliminate or reduce the fluorine-memory effect in an all-in-one chamber approach by cleaning the polymer material from chamber walls after the dielectric etch step using a dry cleaning or similar process. Such a technique increases the cost of ownership COO of the tool, however, as the time required to perform such a clean step reduces throughput of the tool.

Embodiments of the invention eliminate or reduce the fluorine-memory effect by performing the dielectric etch step in a first chamber and performing the photoresist strip and stop layer open in a second, separate chamber. Embodiments of the invention execute the dielectric etch step in the first chamber in a mode that encourages polymer formation on the interior surfaces of the first chamber (sometimes referred to herein as "deposition mode™") and execute the photoresist strip (ashing process) and stop layer open steps in the second chamber in a mode that discourages polymer formation on the interior surfaces of the second chamber (sometimes referred to herein as "clean mode™"). In this manner, the fluorine polymer that accumulates on the walls of the first chamber is not exposed to the ashing process and excellent etch results are obtainable without adverse consequences of the fluorine-memory effect. Also, throughput is not reduced as cleaning the chamber walls after each dielectric etch step is not necessary. Deposition mode™ and clean mode™ are each trademarks of Applied Materials, the assignee of the present invention.

Figure 4:
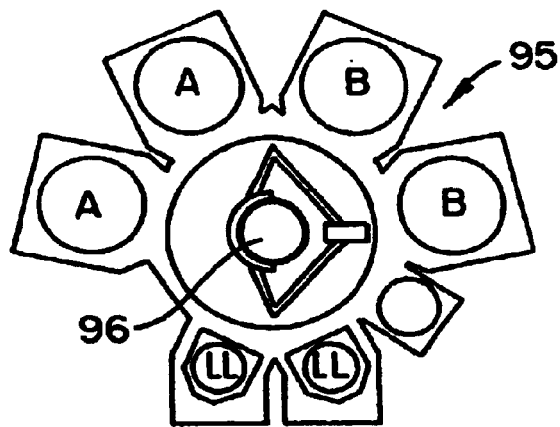
FIG. 4 is a simplified diagram of a multichamber substrate processing systems according to one embodiment of the present invention.

In order to better appreciate and understand embodiments of the present invention, reference is made to FIG. 4, which is a simplified system-level diagram of a multichamber system according to one embodiment of the present invention. The multichamber system shown in FIG. 4 may based on the Centura™ multichamber platform manufactured by Applied Materials as well as on other types of multichamber systems. It is to be understood that the present invention can be used in any multichamber system so long as wafers can be transferred from one chamber to another without being exposed to the ambient of the clean room. FIG. 4 shows a four chamber Centura platform that includes two separate etch chambers (chambers A) to perform the dielectric etch step and two chambers (chambers B) to perform both the photoresist strip and stop layer open steps. It is to be understood that the positions of the chambers shown in FIG. 4 are for illustrative purposes only. The chambers can be positioned differently within the multichamber system and the multichamber system can include fewer or more chambers providing that there is at least one of each of chambers A and chambers B.

In order to perform the dielectric etch sequence shown in FIG. 3 in a system such as the multichamber system 95 shown in FIG. 4, a substrate is transferred into the multichamber substrate processing system through one of the load lock (LL) chambers. A central robot 96 then transfers a substrate from the LL chamber to the substrate processing chamber used to perform step 90 of the dielectric etch sequence, which is one of chambers A in FIG. 4. After the process in chamber A is completed the substrate is transferred by robot 96 to the next chamber, chamber B, where both the photoresist strip and stop or barrier layer etch through steps 92 and 94 are performed on the substrate. When the integrated dielectric etch sequence is completed, the substrate is again transferred to one of the LL chambers for transfer out of multichamber substrate processing system 95.

As would be understood by a person of ordinary skill in the art, when substrate processing system 95 includes multiple chambers to perform the same process step as shown in FIG. 4, two substrates can undergo processing by the system for the same process step in parallel. Thus, the embodiment of FIG. 4 allows for two substrates to simultaneously undergo the dielectric etch step while for two other substrates either the photoresist layer is being stripped or the silicon nitride layer is being etched through.

Referring back to FIG. 3, in embodiments of the invention where the dielectric material being etched in chamber A is a silicon oxide material, such as silicon dioxide, FSG or carbon-doped silica glass, etch step 90 typically includes exposing the layer to a fluorine-containing plasma. The plasma may be formed from an etchant gas that includes one or more fluorocarbon precursors along with other constituents such as nitrogen, oxygen and/or argon. The addition of oxygen to the etchant gas helps with residue removal and helps prevent microtrenching but it reduces the selectivity to the photoresist. Nitrogen has similar but a bit milder effects as does oxygen while adding argon to the process increases the physical etch component but may increase faceting (corner via chopping) or cause profile issues. Carbon monoxide may also be added in some embodiments to scavenge fluorine and oxygen ions. Examples of etchant gases that can be used in step 90 when the dielectric layer is a carbon-doped silica glass material include $CF_4$, $N_2$ and Ar; $C_4F_6$, $O_2$ and Ar; $CHF_3$, $N_2$ and Ar; and $CF_4$, $CH_2F_2$, $O_2$ and $N_2$.

In some embodiments, the dielectric material etched in step 90 includes multiple layers or strata. In such embodiments it may be useful to use a multistep etching process in step 90 that uses different etchant chemistries to each through different strata of the dielectric layer. One example where such a multistep etch process may be beneficial is in an embodiment where a via hole is etched in step 90 and the trench dielectric material is different from the via dielectric material or when a stop layer such as layer 16 is etched between the trench and via layers. Another example includes when an overlying hard mask or antireflective layer is etched in step 90 in addition to the underlying dielectric material.

In still other embodiments a multistep etch process is used where a first, main etch step etches the majority of the dielectric material and a subsequent, overetch step that is highly selective to stop on the stop or barrier layer is then employed to complete the etch process.

In some embodiments where the photoresist material stripped in step 92 is an organic photoresist material commonly used to pattern silicon oxide and similar materials, the photoresist strip step exposes the photoresist to reactive oxygen species (e.g., a plasma formed from $O_2$) or to reactive nitrogen and hydrogen species (e.g., a plasma formed from $NH_3$).

In some embodiments, the barrier layer etched through in step 94 barrier layer is either a silicon nitride (SiN) or silicon carbide film (SiC) that may also contain nitrogen (SiCN). Similar etchant chemistries can be used to open each of these barrier layers. Typically, barrier layer open step 94 employs a low power plasma to avoid sputtering any of the underlying copper layer. In one embodiment the barrier layer open step exposes the barrier layer to a plasma formed from a fluorocarbon and nitrogen. One particular example of an etchant gas that may be used in step 94 includes $CF_4$ and $N_2$. In another embodiment the barrier layer open step is a two step process where the first step exposes the layer to a $CF_4$, $N_2$ plasma and the second step exposes it to a brief $O_2$ post etch plasma treatment to remove any residue that may remain in the area of the contact hole. In still other embodiments, $CHF_3$ and optionally $O_2$ are added to the etchant gas in step 94 increase the etch rate and etch selectivity, respectively. Generally, higher RF power, pressure and $CF_4$ and $N_2$ flows increase the etch rate of the stop layer.

The above etch and strip processes are illustrative in nature only. The present invention is not limited to any particular dielectric etch, photoresist strip or stop layer open chemistries.

As previously stated, some embodiments of the invention perform dielectric etch step 90 in chamber A using a process that encourages polymer formation on the interior surfaces of the chamber and perform photoresist strip and stop layer etch steps 92 and 94 in chamber B using a process that discourages polymer formation on the interior surfaces of the chamber. In these embodiments, both chamber A and chamber B include the capability of managing polymer formation during substrate etching.

Managing polymer formation during the dielectric etch step is a common and important function in order to obtain an accurate, particle-free etch in a number of previously known etching processes. As is known to those of skill in the art, when the dielectric layer being etched is a silicon oxide based material, the dielectric etch process typically includes a fluorine-containing etchant gas such a fluorocarbon (e.g., $C_xF_y$ or $C_xH_yF_z$) gas. Etching such a silicon oxide based material with a fluorine-based plasma produces a fluorine-containing polymer that has a tendency to adhere to interior surfaces of the chamber.

Etch chambers typically have the capability of managing polymer formation during the etch process by minimizing or preventing formation of polymers on the chamber walls or by forcing polymer deposition to chamber walls without particle formation or flaking as any formed particles may result in contamination problems during subsequent processing. Managing polymer formation is a complicated process as polymer formation depends on a number of variables including the gas phase chemistry of the etching process (the etchant gases, chamber pressure, plasma conditions and the material being etched, etc.) and the adhesion of the materials from the gas phase to the chamber walls (which depends on the liner material of the walls, the temperature of the walls and the surface condition of the walls among other factors).

The etch chambers used in some embodiments of the invention include a temperature control system within the walls of each of the different chambers to help manage polymer formation. Such a wall temperature control system can be in the form of fluid passages that circulate a heat exchange fluid, such as an ethylene glycol mixture, through the chamber walls or other appropriate means.

Embodiments of the invention encourage polymer formation on the walls of the dielectric etch chamber (chamber A) by running the chamber in what is referred to as deposition mode™. Basically this entails operating the chamber so that, for a given etching chemistry, polymer formation is forced to the chamber walls so that during the dielectric etch process, there is always a polymer film between the plasma and the chamber walls exposed to the plasma and/or reaction byproducts. This ensures that the plasma always encounters the same material on the chamber walls throughout each dielectric etch step including from the beginning of the step to the end of the step. The thickness of this deposited polymer on the walls in these embodiment is not as important as its existence.

In these embodiments, prior to using the dielectric etch chamber to etch a wafer in a production process, the interior surfaces of the chamber are coated with a fluorine-containing polymer material during a chamber seasoning step. An example of a seasoning step is running a standard recipe with a fixed number (e.g., 25) of conditioning wafers (e.g., bare silicon or blanket photoresist wafers) as opposed to production wafers. This type of "conditioning" or "seasoning" is typically done immediately after a chamber is cleaned, but prior to processing production wafers. Seasoning recipes typically use the same gas chemistry, pressure and power as the production recipe. After the chamber is seasoned in this manner, the chamber is ready to perform dielectric layer etch step 90 on production wafers. If the chamber was not seasoned, the first wafer etched in the dielectric etch process would initially see clean chamber walls (walls without polymer formation) and would thus have different etching results than subsequent wafers.

During operation of the chamber in deposition mode™, polymer deposition on the walls could continue until the coating thickness is sufficient to interfere with the normal operation of the process (e.g., blocking gas flow to the pump) or could become self-limiting (as in the case where the polymer is an insulating material and the surface of the polymer exposed to the plasma reaches a temperature at which no further deposition takes place). In situations where the former occurs, a clean step is used to remove the polymer formation from the chamber walls as is known to those of skill in the art before the etching process suffers deleterious effects due to excess polymer accumulation. After the clean step, the chamber is again seasoned before processing additional production wafers. In one embodiment, a chamber clean step is performed on chamber A after every 100–200 hours of operation.

In one embodiment deposition mode™ includes cooling the chamber walls to a temperature that improves the "sticking" of volatile species that are adsorbed from the gas phase. In one particular embodiment, this includes cooling the chamber walls to 15° C. or less. This temperature may vary in some embodiments depending on the chemistry of the etch step. Additionally, in some embodiments, the interior surfaces of chamber A (the chamber's interior walls where polymer formation occurs) are relatively rough. In some embodiments, interior surfaces of the chamber walls that are exposed to polymer formation are roughened above that of machined aluminum or aluminum alloy.

In some embodiments of the invention, the interior surface of chamber A, which may be aluminum or an aluminum alloy, has a surface roughness ranging from about 100 $R_a$ to about 200 $R_a$ where $R_a$ (the arithmetic roughness average), which is the arithmetic average of the absolute values of the measured profile height deviations, is determined by the following equation in which n is the number of height positions along the line profile, $z_i$ is the height at position i and z is the average height.

$$R_a = \frac{1}{n}\sum_{i=1}^{n} |z_i - \bar{z}|$$

In other embodiments the surface roughness ranges from about 110 $R_a$ to about 160 $R_a$. In one particular embodiment the interior surface of chamber A has a roughened aluminum or aluminum alloy with a topography resembling small rolling hills and valleys. The estimated average height of the hills above the valleys is approximately 16 Φm; the estimate average distance between the hills is approximately 50 Φm, depending on the grade of the aluminum. Typically, the height of the hills ranges from about 8 Φm to about 25 Φm, and the distance between the center of one hill and that of an adjacent hill ranges from about 30 Φm to about 100 Φm.

Such a roughened surface provides pockets in the hills and valleys which provide for the accumulation of semiconductor processing byproducts, such as etch byproducts, preventing the byproducts from redepositing on the surface of the semiconductor substrate being processed. In some embodiments a protective coating (liner material) is applied over the roughened aluminum or aluminum alloy surface in order to improve adhesion of depositing byproducts even further and improve the resistance of the chamber walls to the corrosive etchant plasma. Example protective coatings include anodic oxide, flame spray-deposited aluminum oxide, and other ceramic coatings which may be conductive or non-conductive. Preferably, the protective coating does not alter the roughness of the surface of the chamber wall exposed to polymer accumulation.

One material that is suitable for the interior walls of chamber A is described in U.S. patent application Ser. No. 09/918,683, entitled "Electrochemically Roughened Aluminum Semiconductor Processing Apparatus Surfaces" filed Jul. 27, 2001 and having Jennifer Y. Sun, Clifford C. Stow and Senh Thach as inventors. The Ser. No. 09/918,683 application, which is incorporated by reference herein in its entirety, describes a method of electrochemically roughening aluminum surfaces of a substrate processing chamber. In one particular embodiment, the electrochemically roughened surface is then covered with an aluminum oxide lines such that the interior surface has a roughness of between 100–140 $R_a$.

In contrast, polymer formation is discouraged in the second chamber by running the second chamber in clean mode™. Basically, this entails operating the chamber so that, for a given etching chemistry, the chamber walls are in essentially the same condition after the etching process as before it, i.e., there is no polymer deposition on the chamber walls when the process begins and when it ends. This also ensures that the photoresist strip and stop layer open plasmas always encounter the same material on the chamber walls throughout each of steps 92 and 94 including from the beginning of the step to the end of the step.

Generally, running the chamber in clean mode™ means operating the chamber in a manner that discourages polymer formation on the chamber walls. Some polymer formation may occur during, for example, barrier or stop layer open step 94. In such a case, however, running the chamber in clean mode™ would mean the stop layer open step includes performing a dry cleaning process after the stop layer is etched. Because significantly less polymer formation occurs during etching of the stop layer as compared to the dielectric etch step, especially when the chamber is run in clean mode™, the dry cleaning process that can be used, to eliminate such material from the chamber walls can be relatively brief and does not have a substantial impact on throughput.

In one embodiment the chamber is run in clean mode™ operation by controlling the temperature of the chamber walls so as to not promote "sticking" of volatile species absorbed from the gas phase to the chamber walls. In one embodiment the temperature of the walls is controlled to between about 15° C. and 60° C. This temperature may vary in some embodiments depending on the chemistry involved. In some specific embodiments, the temperature of the walls of the chamber in clean mode™ is kept higher than the temperature of the walls in deposition mode™.

Additionally, in some embodiments the interior surfaces of the chamber that are prone to polymer accumulation have a highly smooth surface that is less rough than the surface of the chamber A walls. In one embodiment, the surface roughness of the second chamber's interior walls that are exposed to possible polymer formation is less than about 32 $R_a$ while in other embodiments the interior surface has a roughness of between 20–32 $R_a$. The interior of chamber B can be made, for example, from a highly smooth aluminum alloy coated by an overlying aluminum oxide protective film. In one particular embodiment, the aluminum alloy is an LP™ alloy (LP™ is a trademark of Applied Materials, the assignee of the present invention).

The LP™ alloy has the following composition by weight %: a magnesium concentration ranging from about 3.5% to about 4.0%, a silicon concentration ranging from 0% to about 0.03%, an iron concentration ranging from 0% to about 0.03%, a copper concentration ranging from 0.02% to about 0.07%, a manganese concentration ranging from about 0.005% to about 0.015%, a zinc concentration ranging from about 0.08% to about 0.16%, a chromium concentration ranging from about 0.02% to about 0.07%, and a titanium concentration ranging from 0% to about 0.01%, with other single impurities not exceeding about 0.03% each and other total impurities not exceeding about 0.1%. Additionally, the LP™ aluminum alloy is required to meet a particular specification with respect to particulates formed from mobile impurities. Of the particulate agglomerations of impurity compounds, at least 95% of all particles must be less than 5 Φm in size. Five (5)% of the particles may range from 5 Φm to 20 Φm in size. Finally, no more than 0.1% of the particles may be larger than 20 Φm, with no particles being larger than 40 Φm. Further details of the LP™ alloy including techniques for relieving stress, for hardening and for coating the alloy with aluminum oxide are disclosed in U.S. patent application Ser. No. 10/071,869, entitled "Halogen-Resistant, Anodized Aluminum for Use in Semiconductor Processing Apparatus" filed Feb. 8, 2002 and having Yixing Lin, Brian T. West, Hong Wang, Shun J. Wu, Jennifer Y. Sun and Clifford S. Stow as inventors. The Ser. No. 10/071,869 application is incorporated by reference herein in its entirety.

II. BRIEF DESCRIPTIONS OF EXEMPLARY CHAMBERS USABLE IN THE PRESENT INVENTION

While a variety of different etch chambers can be used for chamber A as well as chamber B in a multichamber system, several example chambers are set forth below to better illustrate the concepts of some embodiments of the invention. It is to be understood that these exemplary chambers are for illustrative purposes only and that the present invention is not limited to any particular chamber type.

1. Chamber A

Chambers A are high performance etch chambers that can satisfactorily perform the dielectric etch process for integrated circuits having a minimum feature size of 0.25 $\mu$m or below. This may require, for example, etching a via with at least an aspect ratio of 6:1 with an 89° or greater vertical profile at both the top and bottom of the via to maintain the critical dimension at such feature sizes.

In one embodiment of the present invention, each chamber A shown in FIG. 4 can be a magnetically enhanced reactive ion etcher (MERIE) etch chamber, such as the MxP, MxP+, eMxP+, SuperE or eMax chambers manufactured by Applied Materials. Alternatively, chambers A can be any other type of high performance dielectric etch chamber capable of meeting the process performance requirements for the dielectric etch step while forcing polymer deposition to the chamber's walls including, for example, chambers in which a plasma is formed using inductive, microwave or ECR techniques.

Figure 5A:
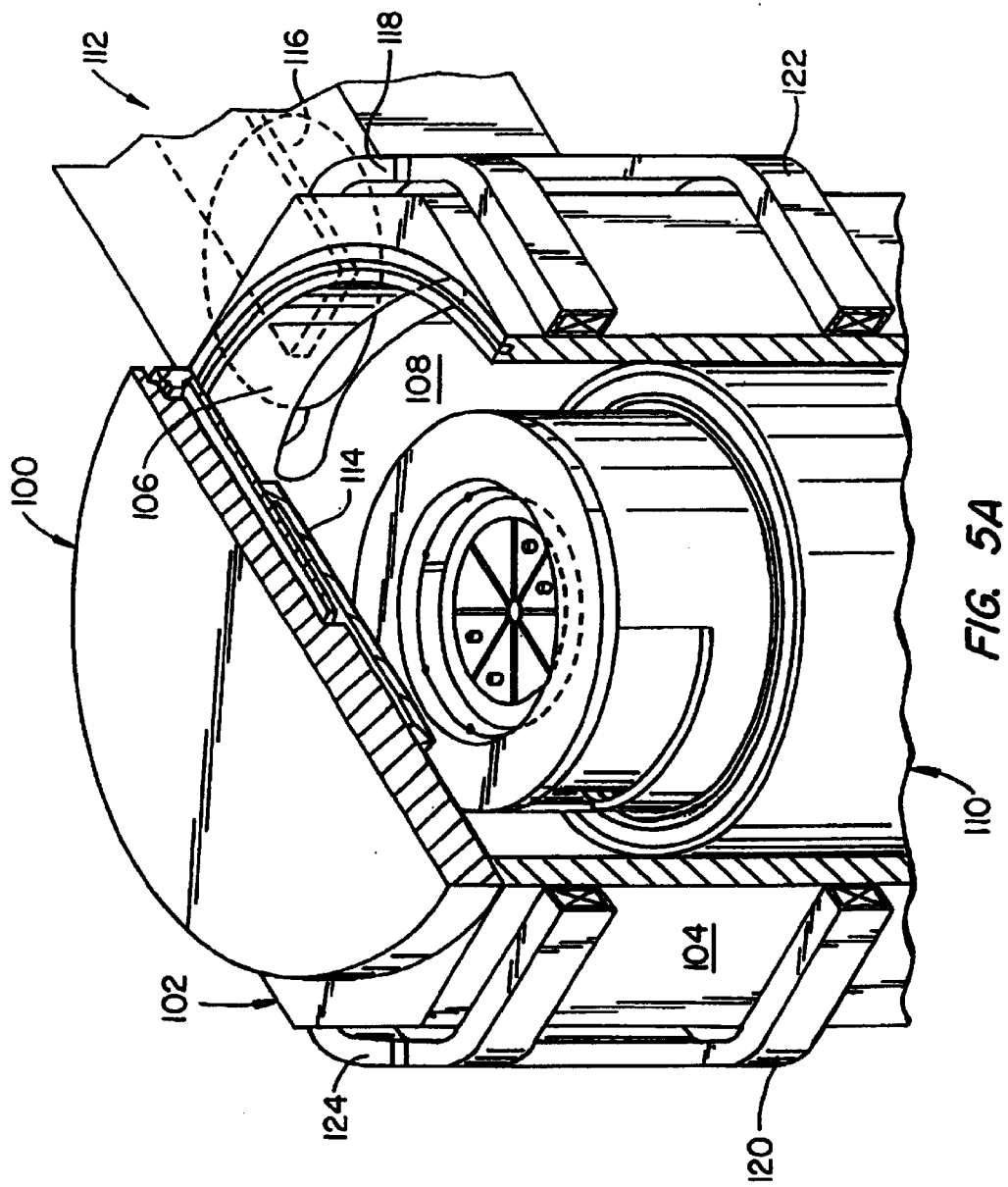
FIGS. 5A–5C are simplified diagrams illustrating various portions of a MERIE chamber which can be used as chamber A shown in FIG. 4 in some embodiments of the present invention.
Figure 5B:
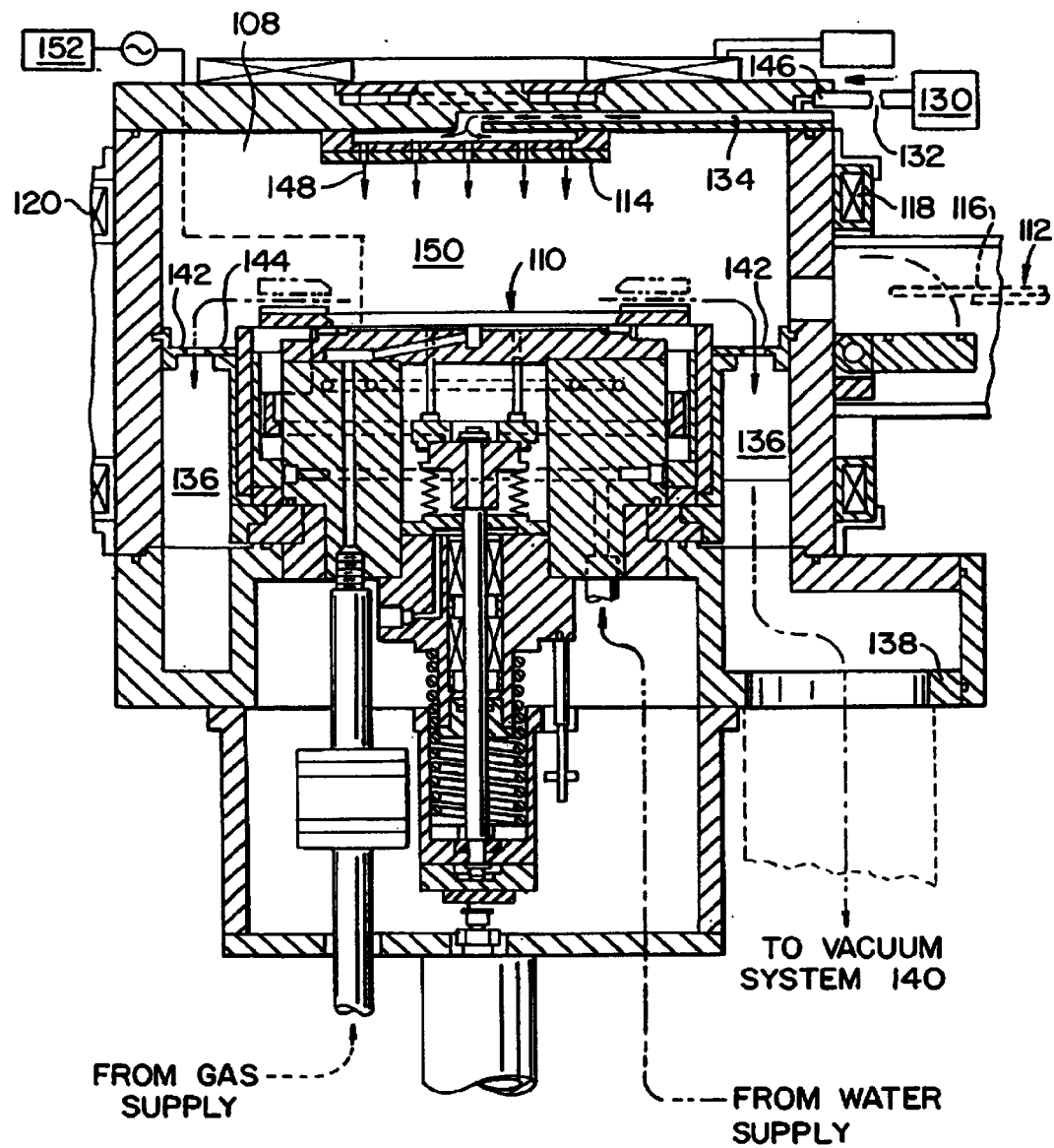
Figure 5C:
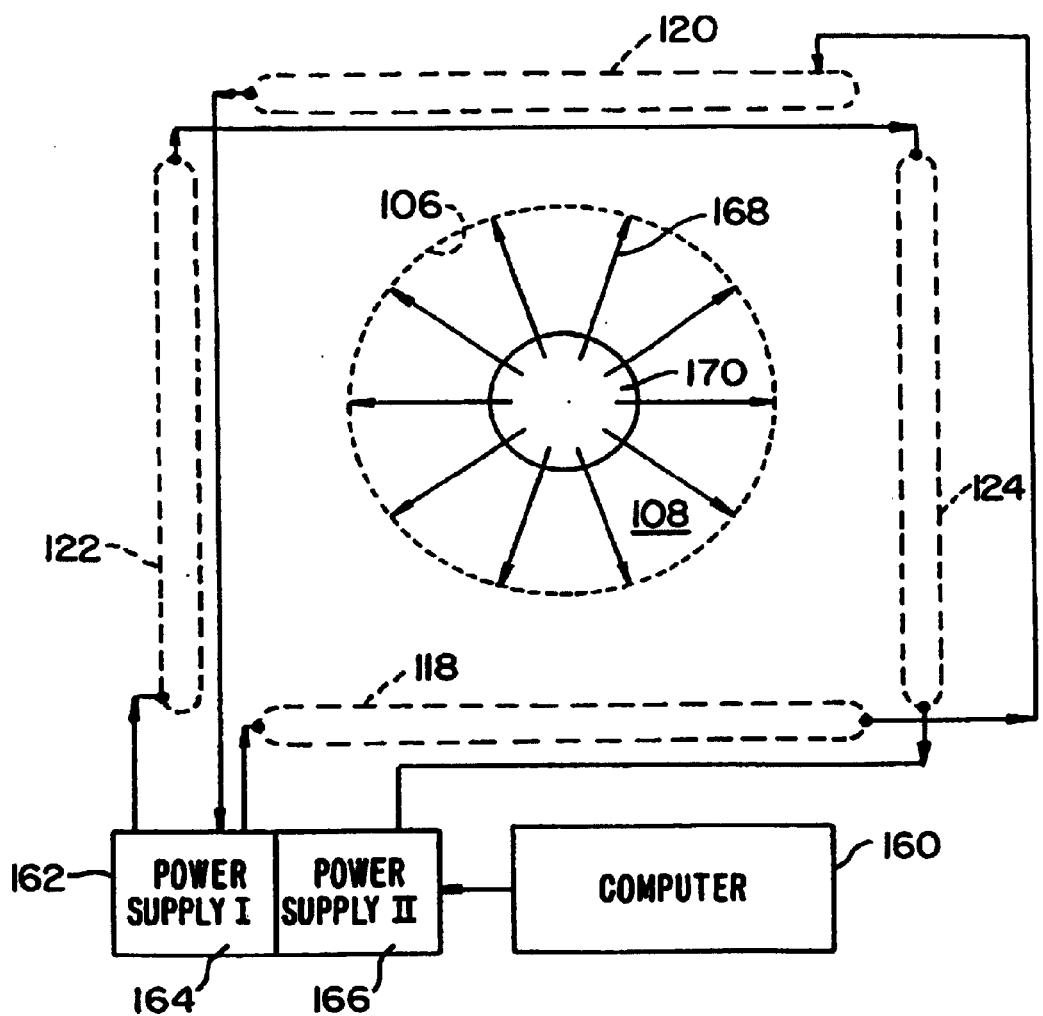

An exemplary chamber A is shown in FIGS. 5A to 5C, where FIGS. 5A and 5B are simplified cross-sectional diagrams of an MERIE chamber 100 and FIG. 5C is a simplified schematic representation of MERIE chamber 100. Referring to FIGS. 5A and 5B, chamber 100 includes a housing 102 having octagon-shaped outer walls 104 and a circular inner wall 106, which has a relatively rough surface compared to the same type of wall in an exemplary chamber B, defining a reaction chamber 108. The system also includes a gas and liquid cooled pedestal/cathode assembly 110 and a wafer (substrate) exchange system 112. Pedestal 110 can be cooled to keep the substrate at a temperature of less than 120° C. during a high bias power etch process in order to prevent photoresist burning. The wafer exchange system 112 cooperates with the pedestal assembly 110 to facilitate positioning a substrate 116 upon assembly 110 and removing the substrate 116 from the chamber 108 after etching.

Process gases are supplied to the interior of the chamber 108 by a gas manifold 114 from a gas supply system 130. The gas supply system 130 communicates with the manifold 114 and chamber 108 via supply lines 132 and conduit 134. Vacuum is supplied to the chamber and spent gases are exhausted via annular exhaust channel 136 communicating with exhaust port 138 connected to a high capacity vacuum pumping system 140 capable of evacuating the chamber to a pressure level of 5 mTorr and less. The exhaust flow is directed from the chamber 108 through holes 142 in a horizontal annular plate 144 mounted about the upper periphery of the cathode assembly 110. The plate 144 inhibits plasma penetration into the annular exhaust chamber 136.

Conduit 134 routes a reactant gas such as a fluorocarbon from inlet 146 into manifold 114. The gas exits the manifold downwardly (as indicated by arrows 148. When RF power is applied to the cathode assembly 110 an etching plasma is formed in chamber processing region 150. An RF power supply system 152 supplies RF power to the reactor system 100 to generate the plasma. RF power system 152 is capable of maintaining a high bias RF power level to promote ion bombardment during the etch process.

To control the plasma, the reactor system 100 further includes a number of electromagnets 118, 120, 122 and 124, typically comprising copper coils, mounted in a rectangular array, one each on alternating outer walls of the octagon-shaped housing 104. As such, adjacent coils are substantially orthogonal to one another. Each coil is substantially rectangular in shape, having opposing upper and lower portions as well as opposing left and right portions that, taken together, define an opening within the rectangular shape of the coils. Each coil is fabricated of 310 turns of 14 gauge insulated, copper wire.

The array of four coils located about the periphery of the chamber places the left portion of each coil adjacent to the right portion of a neighboring coil. The ends of the upper and lower portions of the coils are turned inwardly toward the reaction chamber (by approximately 45 degrees) to substantially match the shape of the octagon-shaped housing.

The remaining component parts of the reactor system depicted in FIGS. 5A and 5B form an operational reactor system which can be used as chamber A in FIG. 4. Referring now to FIG. 5C, a processor 160 is utilized to control the current that is applied to the electromagnets by power supply system 162. Such current control regulates the magnitude and direction (polarity) of the currents supplied to the electromagnets, the magnitude of the magnetic fields generated by the electromagnets and a resultant magnetic field vector formed by the combined magnetic fields generated by each of the electromagnets.

Each coil is connected to an independently controllable DC power supply 164 and 166. The computer 160 controls the current magnitude generated by each power supply. As such, the magnitude of the resultant magnetic field generated by the coils can be varied to select an etch rate and vary ion bombardment of the substrate. The current magnitudes are typically selected from a menu or table of current magnitudes in order to produce a controlled enhancement of plasma density and uniform etch rate. In response, the computer retrieves an appropriate command signal from a current magnitude table. Such current magnitude tables are stored in the memory of the computer 160.

The power supply system 162 applies the selected magnitude currents to the coils in the electromagnets while the reactor of FIGS. 5A and 5B processes a substrate or wafer. During such processing, the currents applied to the coils produce a rotating magnetic field generally transverse to the plane of the wafer that results in improved uniformity of the plasma over the surface of the wafer. A similar effect can be obtained using a rotating turn table having permanent magnetics in a fixed orientation.

Some embodiments of chamber 100 include a quartz or similar window (not shown) on the top of the chamber along with an integrated optical sensor or interferometric tool (not shown in FIGS. 5A–5C) that detects and measures plasma emissions reflected off the substrate surface. Integrated interferometric tools employ light wave reflection and interference phenomena to determine etch progress characteristics (e.g., depth and etch rate). In some embodiments, the interferometric signals (i.e., fringes) that are recorded at normal or off-vertical incidence as the dielectric film is etched can be used to trigger etch completion once a dialed-in target depth has been achieved. Endpointing the trench etch process in this manner has the benefit of eliminating middle stop layer 16 from the dual damascene structure, which simplifies processing and reduces the overall k value of the dielectric stack. In other embodiments the optical sensor can be used to monitor the etch process to determine if the process drifts outside of certain predetermined ranges that may indicate a likelihood of decreased yield and, if so, stop the process.

Traditionally, interferometric techniques have been used for measuring blanket film thickness. However, patterned wafers produce interferometric signals that are difficult to deconvolve as multiple etch fronts contribute to the observed signal. The temporal normal reflected light intensity during etching contains frequency components introduced by etching the photoresist mask surface and the exposed dielectric surface. To extract the frequency component associated with etching dielectric films and amplify its signal-to-noise ratio, the interferometric tool used. In one embodiment of the invention, employs two techniques.

One technique uses the polarization effect. When normal incident unpolarized light is reflected from a dielectric surface, the reflectivity of the linear polarization component parallel to the direction of the trench differs from the one perpendicular to the trench. This difference is more significant when the trench width is smaller than the wavelength used for detection. At the same time, the reflectivity of both polarized components from the featureless area of photoresist is almost the same. Therefore, the ratio of these two signals can greatly reduce the interference signal from the featureless area of photoresist.

The second technique involves digital signal processing (DSP), which employs several real-time filters to average out the magnetic field and separate the undesired photoresist signal from the dielectric film signal. The real-time signal includes three frequencies originating from the photoresist ($o_{PR}$), dielectric film ($o_{ox}$), and the magnetic field modulation ($o_{mas}$), respectively. The signal attributed to the dielectric film is that remaining after filtering has first removed the contribution from the magnetic field and then the contribution from the photoresist.

One embodiment of the integrated rate optical sensor, referred to as an integrated rate monitor (iRM™), uses both of the techniques described above to isolate the signal emanating from the dielectric and enhance the signal-to-noise ratio (SNR). Also, the reflected light may be cross-polarized to filter out contributions from the featureless photoresist digital signal processing to further enhance the SNR. The monitor requires no external light source for its operation; instead, it uses the naturally emitted light from the plasma in the process chamber.

Another example of an MERIE reactor which could be used as chamber A is the DRM sold by Tokyo Electron of Japan, in which a rotating magnetic field transverse to the plane of the wafer is supplied by an array of permanent magnets mechanically rotating about the processing chamber. Other examples of chamber A embodiments could be high performance RIE reactors which may have multiple, separately controllable power inputs into different chamber electrodes, and which may also have power supplies operated at higher powers and frequencies, and furnishing multiple frequencies, as is well-known in the art.

Of course these are just several examples of different high performance etch chambers that could be used as chamber A shown in FIG. 4. High density plasma etch chambers can be used in other embodiments. The minimum feature set that a high performance etch chamber must include to be able to perform the demanding dielectric etch step (e.g., etching a silicon oxide family material) according to the present invention includes: (1) the ability to bias the wafer to promote ion bombardment during the etch process and maintain the bias level at a relatively high power level, (2) high pumping capacity with a high capacity vacuum pump system that is capable of evacuating the chamber to a process pressure level of 50 mTorr and below and preferably to at least a pressure level of 5 mTorr, (3) a low temperature control pedestal, and (4) the capability to manage polymer formation and force polymer deposition to chamber walls without particle formation or flaking during the etch process as previously described.

A high capacity vacuum system typically includes a turbo molecular pump and a mechanical pump but can include any appropriate vacuum system that enables pressure levels of 50 mTorr or less to be accurately maintained within the chamber. A low temperature control pedestal is capable of cooling the substrate to less than 120° C. or less during the etch operation in order to prevent "burning" of the photoresist. The availability of such temperature control allows process engineers to control the substrate temperature to improve etch selectivity to photoresist, increases the dielectric etch rate and prevent the photoresist from burning. One particular low temperature control pedestal circulates a liquid through the pedestal that is cooled by a chiller as is known to those of skill in the art.

2. Chamber B

Chambers B shown in FIG. 4 are designed to perform both the photoresist stripping operation and silicon nitride or other stop layer etching operation in a single chamber. While in one embodiment chambers B do not require the same level of ultra high performance achievable by chambers A, in other embodiments chambers B are very similar to chambers A with a primary difference being the surface roughness of the interior chamber walls that are exposed to possible polymer accumulation.

In some embodiments, chambers B employ a roof and/or interior chamber walls made from quartz, ceramic or a similar material that is resistant to chemical attack. As discussed above in one embodiment, the interior walls of chamber B that are exposed to reaction byproducts are made from a highly smooth surface such as the LP™ alloy. Also, some embodiments include hardware to minimize polymer formation by controlling the temperature of the chamber walls as discussed above.

In order to perform the photoresist strip and stop layer open steps satisfactorily, chambers B include a high capacity vacuum system and a bias system that, at a minimum, enables the chamber to maintain a relatively low bias power of 200 Watts or less. In one embodiment, the plasma generation system for chambers B includes a single source RF power generator coupled to a coil or rooftop electrode and a low bias RF power generator coupled to the pedestal. Low bias power is necessary to etch through the silicon nitride or other stop layer without causing excessive sputtering to the underlying copper layer in a dual damascene copper process. In some embodiments, chambers B are powered by a remote power source, such as a microwave, toroidal or inductive power source that generates plasma remotely and then flows chemically modified species or radicals into the substrate etching chamber. Chambers B may also include hardware that enables the formation of an in situ plasma or a remote plasma formation system to enable a plasma dry cleaning step after each photoresist strip and/or stop layer etch operation.

In one embodiment, chamber B may be a MERIE chamber such as those described with respect to chamber A. One primary difference between the chamber B MERIE chamber and the chamber A MERIE chamber in one embodiment is that the surface of the interior chamber A wall(s) is rougher than the same surfaces in chamber B. As previously stated above, in one particular embodiment, the interior wall of the chamber A MERIE chamber may be roughened to a level of over 100 $R_a$ in order to better collect polymer byproduct deposition on the interior walls while the interior wall of the chamber B MERIE chamber may made from a relatively smooth material having a surface roughness of 32 $R_a$ or less. An additional difference in another embodiment where both chambers A and B are MERIE chambers is that an optical sensor that detects and measures plasma emissions in order to endpoint the dielectric etch process is incorporated into chamber A while no optical sensor is included in chamber B.

In other embodiments, chamber B does not include a high power RF bias system. Additionally, some embodiments of chamber B further prevent polymer formation on the chamber walls by including a gas distribution system that establishes a gas flow that pumps particles out of the chamber and into the exhaust stream by flowing a purge gas from the bottom or sidewall of the chamber.

III. INVENTION EXAMPLES AND EXPERIMENTAL RESULTS

In order to further illustrate the concepts of the invention set forth below are a number of examples of etch processes according to embodiments of the present invention. The invention examples set forth below can be used to successfully pattern a damascene or dual damascene structure usable for integrated circuits having 0.18 micron critical dimensions without critical dimension loss and without adverse effects such as bowing or k-value shifts in an eMAX chamber manufactured by Applied Materials. In the examples, processes for etch step 90 are run in an eMAX chamber operated in deposition mode and processes for step 92 and, if employed, step 94 are run in an eMAX chamber operated clean mode. The eMAX chamber run in deposition mode included a standard aluminum oxide chamber liner that has a roughness of 120±20 $R_a$ while the eMAX chamber run in clean mode had an LP liner coated with aluminum oxide that provided a highly smooth surface (less than 32 $R_a$) as discussed above. Other than this primary difference, the two eMAX chambers were substantially similar.

Invention Example 1

Figure 6A:
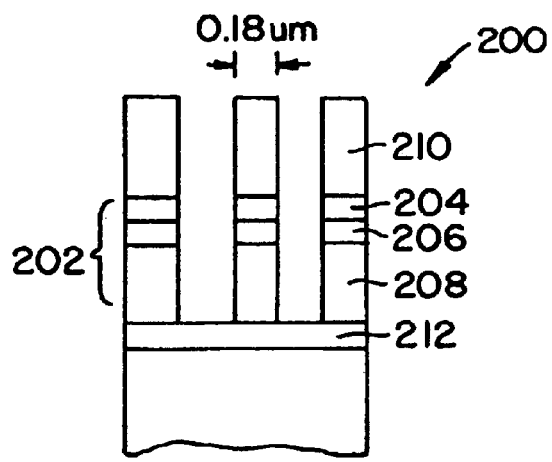
FIGS. 6A–6C are simplified cross-sectional illustrations of various structures that may be etched in accordance with embodiments of the present invention.

The first example is particularly useful for a single damascene metal 1 trench etch process. In some applications it is common to form such a single damascene structure for a metal 1 layer before using a dual damascene approach to additional, overlying metal layers. FIG. 6A shows an example of a substrate 200 having a three layer dielectric stack 202 to be etched in step 90. Dielectric stack 205 includes an organic, bottom antireflective coating (BARC) 204, formed over an inorganic, dielectric antireflective coating (DARC) 206, which is formed over a Black Diamond™ layer 208. A deep UV photoresist material 210 is formed over the dielectric stack and a BloK™ layer 212 separates the dielectric stack from the underlying substrate.

Table 1 set forth below shows the basic steps used to etch the dielectric material, strip the photoresist and open the barrier layer (steps 90, 92 and 94, respectively). As shown in Table 1, step 90 includes two separate steps: a first main etch step and a second over etch step that is highly selective to the underlying BloK™ material.

TABLE 1

PROCESSES CONDITIONS FOR INVENTION EXAMPLE 1

| Parameter | Dielectric Etch | Photoresist Strip | Stop Layer Open |
|---|---|---|---|
| Gas Flows | $CF_4$ 70–100 sccm<br>$N_2$ 0–100 sccm<br>Ar 0–500 sccm | $C_4F_6$ 10–30 sccm<br>$O_2$ 10–30 sccm<br>0–1000 Ar sccm | $O_2$ 100–500 sccm | $CF_4$ 5–30 sccm<br>$N_2$ 0–100 sccm |
| Source Power | 300–1000 W | 1000–1800 W | 100–500 W | 100–400 W |
| Pressure | 100–300 mTorr | 40–100 mTorr | 80–400 mTorr | 20–60 mTorr |
| B-field | 0–40 Gauss | 40 Gauss | 0 Gauss | 0 Gauss |
| Cathode Temp. | 15° C. | 15° C. | 15° C. | 15° C. |
| Wall Temp. | 15° C. | 15° C. | 15° C. | 15° C. |

The inventors performed a number of different tests to determine the effects of varying certain process conditions and/or add additional precursor gases to the etchant gas in the main dielectric etch step. Generally, higher RF power increased the etch rate and improved microloading. It also adversely affected photoresist selectivity, striation and microtrenching, however. Adding argon and/or carbon monoxide improved microtrenching but reduced etch rate. Higher pressures tend to reduce microtrenching and improve etch rate, but they also tend to bow the etched profile. Wall temperature and backside helium temperature can be optimized to improve etch uniformity. FIG. 7 is a chart depicting the major process trends for the main etch portion of the dielectric step set forth above in Table 1. Also, substituting $N_2$ and CO for $O_2$ and Ar in the over etch portion of the dielectric etch step resulted in no striation due to the high selectivity between this over etch chemistry and the photoresist but resulted in a tapered profile of the etched trenches.

Invention Example 2

Figure 6B:
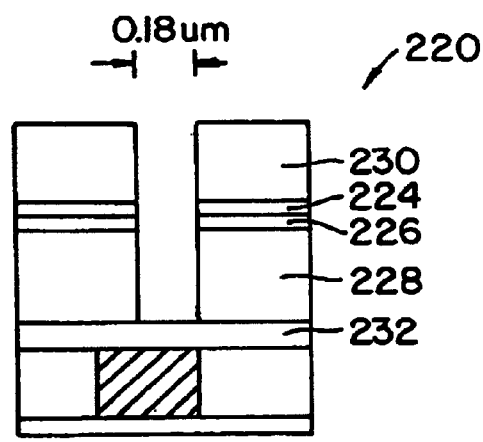

The second example is particularly useful for a via etch process such as one used to etch via 222 in substrate 220 shown in FIG. 6B. Substrate 220 includes a BARC layer 224 formed over a DARC layer 226, which is formed over a Black Diamond™ 228. Layer 228 serves as both the trench and via dielectric layers. A deep UV photoresist material 230 is formed over the dielectric stack and a BloK™ layer 232 separates the dielectric stack from the underlying substrate. A middle stop layer is not included between the trench and dielectric layers as the process relies on the iRM to endpoint the trench etch in a later step.

This example etches a via in the substrate 220 using a three-step etch process as dielectric etch step 90 that is highly selective to the photoresist and bottom BloK™ layer. In the first step, the BARC layer is etched using a $CF_4$ plasma; the main etch step uses a $CHF_3$ and $N_2$ plasma and the final, over etch step uses a $C_4F_6$, $O_2$ and CO plasma. Further details of dielectric step 90 used in example 2 are supplied in Table 2 below. The subsequent photoresist strip step was carrier out as set forth in Example 1.

TABLE 2

PROCESS CONDITIONS FOR INVENTION EXAMPLE 2

| Parameter | BARC Etch | Main Etch | Over Etch |
|---|---|---|---|
| Gas Flows | $CF_4$ 150 sccm | $CHF_3$ 10–30 sccm<br>$N_2$ 10–30 sccm<br>Ar 500–1200 sccm | $C_4F_6$ 10–25 sccm<br>$O_2$ 10–35 sccm<br>CO 0–800 sccm |
| Source Power | 700 W | 600–1500 W | 1000–1800 W |
| Pressure | 100 mTorr | 50–150 mTorr | 20–80 mTorr |
| B-field | 20 Gauss | 0–50 Gauss | 30 Gauss |
| Cathode Temp. | 15° C. | 15° C. | 15° C. |
| Wall Temp. | 15° C. | 15° C. | 15° C. |

The inventors also performed a number of different tests to determine the effects of varying certain process conditions and/or add additional precursor gases to the etchant gas in the main dielectric etch step for example 2. FIG. 8 is a chart depicting the major process trends for the main etch portion of the dielectric step set forth above in Table 2.

Invention Example 3

Figure 6C:
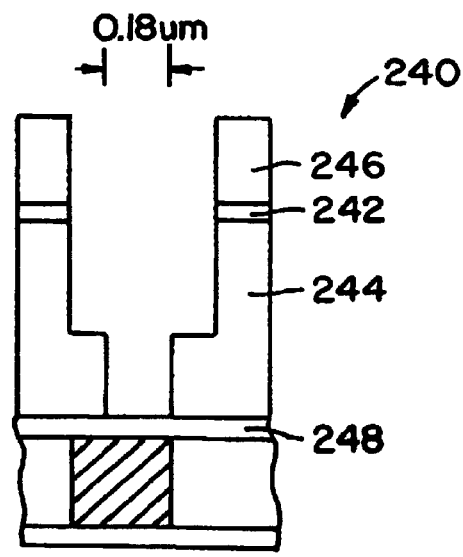

The third example is particularly useful for a dual damascene trench etch process such as one used to etch substrate 240 shown in FIG. 6C. Substrate 240 includes a DARC layer 242 formed over a Black Diamond™ layer 244. The Black Diamond™ layer 244 serves as both the trench and via dielectric layers and does not include a middle stop layer. A deep UV photoresist material 246 is formed over the dielectric stack and a BloK™ layer 248 separates the dielectric stack from the underlying substrate.

In this example a trench may be etched in substrate 240 using a two step etch process, such as that shown in Table 3 below, as dielectric etch step 90. In the first step, the DARC layer is etched using a $CF_4$ plasma while the main trench etch step uses a $CF_4$, $N_2$ and Ar plasma. The subsequent photoresist strip and stop layer open steps 92 and 94 may use the same parameters as these shown in Table 1 above.

TABLE 3

PROCESSES CONDITIONS FOR INVENTION EXAMPLE 3

| Parameter | | Dielectric Etch |
|---|---|---|
| Gas Flows | $CF_4$ 90 sccm | $CF_4$ 30–100 sccm<br>$N_2$ 0–50 sccm<br>Ar 0–500 sccm |
| Source Power | 300 W | 300–1000 W |
| Pressure | 100 mTorr | 100–400 mTorr |
| B-field | 0 Gauss | 0–40 Gauss |
| Cathode Temp. | 15° C. | 15° C. |
| Wall Temp. | 15° C. | 15° C. |

Increasing the RF power in the dielectric etch step increases the etch rate and improves microloading. It also adversely affects photoresist selectivity, striation and microtrenching, however. Higher pressures tend to improve microtrenching, etch rate, corner faceting and photoresist selectivity, but also tend to bow the etched profile. High Ar flows improve microloading while the absence of $N_2$ gas generally give a bowing trench profile and lower photoresist selectivity. High Ar and/or $N_2$ flows, however, create more faceting.

Comparison Tests

In order to prove the effectiveness of the present invention, tests comparing the three step etch process according to the present invention to an all-in-one three step etch process performed in a single chamber according to previously known technique were also performed. These tests etched a dual damascene trench such as that shown in FIG. 6C in a multilayer dielectric stack that included a DARC layer formed over a Black Diamond™ layer which was in turn formed over a BloK™ barrier layer.

The tests that used the all-in-one chamber approach used an eMAX chamber manufactured by Applied Materials that had a standard liner. The chamber was run in dep mode during step 90 and in clean mode during steps 92 and 94. The parameters used in the all-in-one dielectric etch step and photoresist strip step are set forth below in Table 4. As evident in Table 4, the dielectric etch step according to this previously known process included a two-step etch process where the first step etched the DARC layer and the second step etched the main dielectric layer.

TABLE 4

| Parameter | DARC Etch | Main Etch | Photoresist Strip |
|---|---|---|---|
| Gas Flows | $CF_4$ 90 sccm | $CF_4$ 80 sccm<br>$N_2$ 20 sccm<br>100 Ar sccm | $O_2$ 250 sccm |
| Source Power | 300 W | 500 W | 200 W |
| Pressure | 100 mTorr | 200 mTorr | 80 mTorr |
| B-field | 0 Gauss | 10 Gauss | 0 Gauss |
| Cathode Temp. | 15° C. | 15° C. | 15° C. |
| Wall Temp. | 15° C. | 15° C. | 15° C. |
| Inner He Zone | 16 torr | 10 torr | 8 torr |
| Outer He Zone | 10 torr | 10 torr | 16 torr |

When run as part of an all-in-one process, the etch step and photoresist strip process shown in Table 4 produced trenches that suffered critical dimension loss and exhibited signs of bowing. Drawings depicting a cross-sectional view of these trenches as seen in SEM photographs are shown in FIG. 9A. The trenches showed similar profiles at both the center and edges of the substrate. Also, in areas where the vias were formed, the all-in-one process overetched the via even etching through the underlying BloK™ barrier layer. Drawings depicting a cross-sectional view of this over etching process as seen in SEM photographs are shown in FIG. 9B.

In contrast, tests conducted according to an embodiment of the present invention where separate chambers having different roughness liners were used produced trenches in which the critical dimensions were accurately preserved and vias that stopped on the stop layer. Drawings depicting the trench and via areas of the process of in areas of a substrate similar to those shown in FIGS. 9A and 9B are shown in FIGS. 10A and 10B, respectively. Table 5, below, sets forth the parameters used in this experiment. As shown in Table 5, etch step 90 included separate DARC and main etch steps as was done in the all-in-one chamber approach.

TABLE 3

| Parameter | DARC Etch | Main Etch | Photoresist Strip |
|---|---|---|---|
| Gas Flows | $CF_4$ 90 sccm | $CF_4$ 80 sccm<br>$N_2$ 20 sccm<br>Ar 100 sccm | $O_2$ 250 sccm |
| Source Power | 300 W | 500 W | 200 W |
| Pressure | 100 mTorr | 200 mTorr | 80 mTorr |
| B-field | 0 Gauss | 10 Gauss | 0 Gauss |

TABLE 3-continued

| Parameter | DARC Etch | Main Etch | Photoresist Strip |
| --- | --- | --- | --- |
| Cathode Temp. | 15° C. | 15° C. | 15° C. |
| Wall Temp. | 15° C. | 15° C. | 15° C. |
| Inner He Zone | 16 torr | 10 torr | 8 torr |
| Outer He Zone | 10 torr | 10 torr | 16 torr |

IV. ADDITIONAL EMBODIMENTS OF THE PRESENT INVENTION

Figure 11:
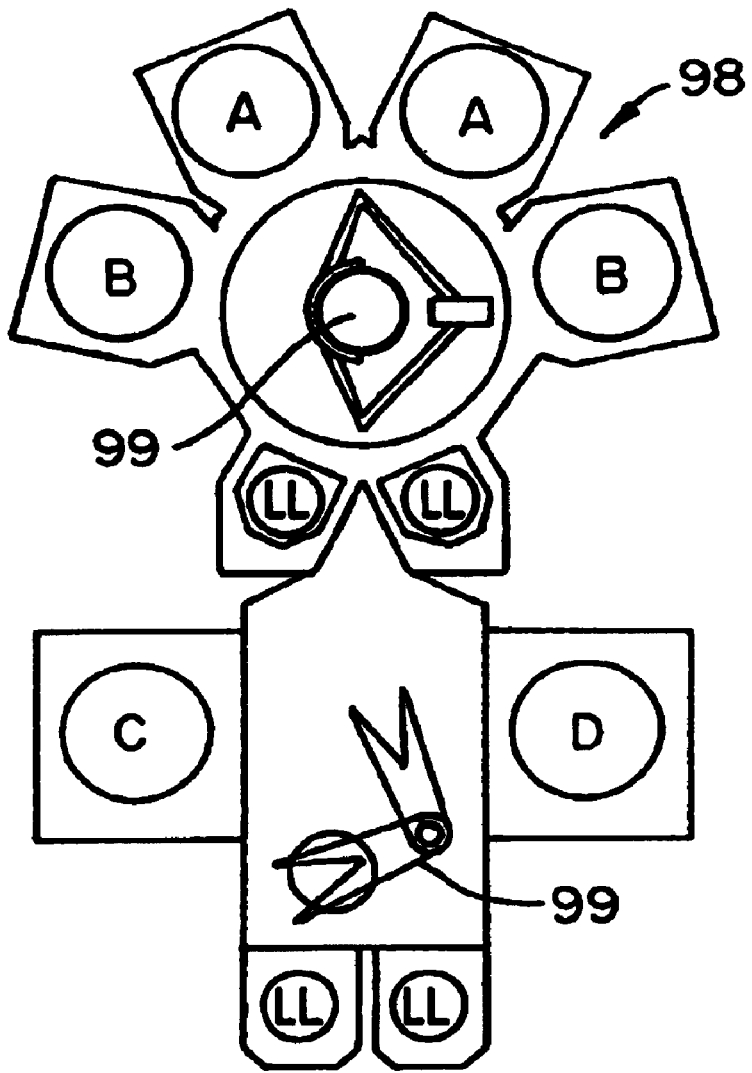
FIG. 11 is a simplified diagram of a multichamber substrate processing systems according to another embodiment of the present invention.

In still other embodiments of the present invention, additional chambers are added to a multichamber system in order to perform a contact clean step and/or optically measure the critical dimensions (CD) of features etched in chambers A and B prior to depositing copper barrier and seed layers over the substrate. FIG. 11 shows one embodiment of such a system 98 that further includes a chamber C and a chamber or tool D. Importantly, substrates can be transferred between chambers A, B, C and D by one or more robots 99 without being exposed to the clean room ambient.

In one embodiment, chamber C is a wet cleaning chamber that exposes the substrate to vapor of a solvent such as EKT or water as is known to those of skill in the art in order to remove polymer or other residuals build up, if any, within the etched structure. Chamber C includes a spraying/vaporizing nozzle that sprays the solvent at a high vapor pressure so that the solvent evaporates after reaching the substrate. The solvent is sprayed over the substrate while the substrate is positioned on a spinning pedestal in order to achieve a uniform coating across the entire surface of the substrate. It is important that the solvent evaporate so that when the substrate is transferred out of chamber C by the central robot through the center wafer transfer chamber, liquid solvent does not drip off the substrate and contaminate the wafer transfer area.

In other embodiments chamber C is a plasma chamber that exposes the substrate to an etchant gas such as an in situ dry cleaning process. In still other embodiments chamber C exposes the substrate to a supercritical fluid that has the density of a gas and the solubility of a liquid.

After removing polymer and/or other residue from within the trenches in chamber C, the substrate may be transferred to chamber or tool D to measure the critical dimensions of the etched trenches. Embodiments of the invention perform a residue removal step in chamber C prior to transferring the substrate into chamber/tool D because the polymer and other material that may be stuck within the etched trenches after step 94 would interfere with any critical dimension measurements taken in chamber/tool D.

In one embodiment, chamber/tool D is a NanoSpec 9000 CD manufactured by Nanometrics. The NanoSpec 9000 can measure critical dimensions (CDs) below 0.10 microns including measuring CDs at both the top and bottom of trenches. It uses a diffracted light signature technique that provides a high throughput, low cost means of performing CD measurements. The NanoSpec 9000 uses multiple wavelengths and a normal incidence angle to perform its CD analysis in real time by referencing a library of previously measured CD results for specific line-profile characteristics. Other embodiments may use different tools to measure the CD of etched trenches.

Some embodiments of the invention take CD measurements on every wafer processed in system 98. Other embodiments take measurements from only every X wafers where X is an integer that may range, for example, from 2 to 25. Embodiments of the invention use the CD measurements taken in tool D to provide feedback to future dielectric etch sequences performed in chambers A and B. If, for example, tool D detects that CD measurements do not meet manufacturers' specifications for a particular substrate, a controller may shut system 100 done so that the reason for the deviation outside of the specs range may be determined and fixed. This may prevent the processing of numerous subsequent substrates that would also likely have trenches etched with CDs outside of the manufacturer specifications and therefore have unacceptably low yields.

Having fully described at least one embodiment of the present invention, other equivalent or alternative methods of practicing the present invention will be apparent to those skilled in the art. For example, while the present invention was primarily described in conjunction with a via-first dual damascene etch process, the invention is applicable to any dielectric etch process that etches through a primary dielectric layer and an etch stop layer and requires stripping a photoresist layer. Accordingly, the invention is applicable to a trench-first, self-aligned (e.g., the middle stop layer is patterned so that the trench and via etch can be done at the same time), dual hard mask and bi-layer resist dual damascene etch process as well as single damascene processes and non-damascene processes. Also, while examples of the invention included etching a Black Diamond™ SiOC layer, the invention is applicable to other SiOC layers such as Coral™ films and Aurora™ films. These equivalents and alternatives along with the understood obvious changes and modifications are intended to be included within the scope of the present invention.

What is claimed is:

1. An integrated etch process performed in a multichamber substrate processing system having first and second chambers, said process comprising:
    transferring a substrate having formed thereon in a downward direction a patterned photoresist mask, a dielectric layer and a barrier layer into said first chamber;
    etching said dielectric layer in said first chamber to transfer said pattern into said dielectric layer, wherein said etching process is run in a mode that encourages polymer formation on an interior surface of said first chamber;
    transferring the substrate from said first chamber to said second chamber under vacuum conditions; and
    in said second chamber, stripping the photoresist mask and subsequently etching said barrier layer prior to exposing said substrate to an ambient, wherein said barrier layer etching process is run in a mode that discourages polymer formation on an interior surface of said second chamber.

2. The process of claim 1 wherein said etching step in said first chamber includes cooling said interior surface of said first chamber to a first temperature.

3. The process of claim 2 wherein said etching step in said second chamber includes controlling a temperature of said interior surface of said second chamber to a second temperature to minimize polymer formation on said surface.

4. The process of claim 3 wherein the first temperature is less than the second temperature.

5. The process of claim 1 wherein said dielectric layer is either a carbon-doped silica glass layer or a fluorosilicate glass (FSG) layer.

6. The process of claim 5 wherein said barrier layer is selected from the group consisting of a silicon nitride layer or a silicon carbide layer.

7. The process of claim 5 wherein said dielectric layer is etched in said first chamber with a plasma formed from a fluorocarbon gas.

8. The process of claim 7 wherein said fluorocarbon gas comprises $C_4F_6$.

9. The process of claim 8 wherein said multichamber system further includes a third chamber and a tool to measure a critical dimension of a structure etched in said first and second chambers, wherein said methods further comprises:
after said stop layer is etched in said second chamber, transferring the substrate to said third chamber to clean the etched wiring pattern; and
thereafter, transferring said substrate to said tool to measure a critical dimension associated with said etched structures;
wherein said substrate is not exposed to a clean room or others ambient between being transferred into said first chamber and being transferred into said tool.

10. The process of claim 1 wherein the step of etching said dielectric layer includes exposing the layer to a plasma formed from an etchant gas comprising $C_4F_6$.

11. The process of claim 10 wherein the barrier layer is a silicon carbide layer.

12. An integrated etch process performed in a multichamber substrate processing system having first and second chambers, said process comprising:
transferring a substrate having formed thereon in a downward direction a photoresist mask patterned according to a pattern, a dielectric layer and a barrier layer into said first chamber, wherein an interior surface of said first chamber has a first surface roughness;
etching said dielectric layer in said first chamber to transfer said pattern into said dielectric layer, wherein said etching process is run in a mode that encourages polymer formation on said interior surface of said first chamber;
transferring the substrate from said first chamber to said second chamber under vacuum conditions, wherein an interior surface of said second chamber has a second surface roughness that is less then said first surface roughness; and
in said second chamber, stripping the photoresist mask and subsequently etching said barrier layer prior to exposing said substrate to an ambient, wherein said barrier layer etching process is run in a mode that discourages polymer formation on said interior surface of said second chamber.

13. The process of claim 12 wherein said dielectric layer is either a carbon-doped silica glass layer or a fluorosilicate glass (FSG) layer.

14. The process of claim 13 wherein said barrier layer is selected from the group consisting of a silicon nitride layer or a silicon carbide layer.

15. The process of claim 13 wherein said dielectric layer is etched in said first chamber with a plasma formed from a fluorocarbon gas.

16. The process of claim 12 wherein said interior surface of said first chamber has a roughness between about 100 and 200 $R_a$.

17. The process of claim 12 wherein said interior surface of said first chamber has been roughened above that of machined aluminum.

18. The process of claim 16 wherein said interior surface of said first chamber has a roughness of between 100 and 140 $R_a$.

19. The process of claim 18 wherein said interior surface of said first chamber comprises an aluminum oxide coating.

20. The process of claim 12 wherein said interior surface of said second chamber has a roughness of less than 32 $R_a$.

21. The process of claim 12 wherein said multichamber system further includes a third chamber and a tool to measure a critical dimension of a structure etched in said first and second chambers, wherein said method further comprises:
after said stop layer is etched in said second chamber, transferring the substrate to said third chamber to lean the etched wiring pattern; and
thereafter, transferring said substrate to said tool to measure a critical dimension associated with said etched structures;
wherein said substrate is not exposed to a clean room or others ambient between being transferred into said first chamber and being transferred into said tool.

22. The process of claim 12 wherein the step of etching said dielectric layer includes exposing the layer to a plasma formed from an etchant gas comprising $C_4F_6$.

23. The process of claim 22 wherein the barrier layer is a silicon carbide layer.

24. The process of claim 12 wherein said pattern is a wiring pattern.

25. An integrated trench etch process performed in a multichamber substrate processing system having first and second chambers, said process comprising:
transferring a substrate having formed thereon in a downward direction a patterned photoresist mask, a silica glass dielectric layer and a barrier layer into said first chamber, wherein said photoresist mask is patterned according to a wiring pattern and wherein an interior surface of said first chamber has a roughness of at least 100 $R_a$;
etching said dielectric layer in said first chamber to transfer said wiring pattern into said dielectric layer, wherein said etching process is run in a mode that encourages polymer formation on said roughened interior surface of said first chamber;
transferring the substrate from said first chamber to said second chamber under vacuum conditions, wherein an interior surface of said second chamber has a roughness of less than that of said interior surface of said first chamber; and
in said second chamber, stripping the photoresist mask and subsequently etching said barrier layer prior to exposing said substrate to an ambient, wherein said barrier layer etching process is run in a mode that discourages polymer formation on said interior surface of said second chamber.

26. The process of claim 25 wherein said etching step in said first chamber includes cooling said interior surface of said first chamber.

27. The process of claim 26 wherein said etching step in said second chamber includes controlling a temperature of said interior surface of said second chamber to minimize polymer formation on said surface.

28. The process of claim 25 wherein the roughness of the interior surface of the second chamber is less than 32 $R_a$.

29. The process of claim 25 wherein the roughness of the interior surface of the second chamber is between about 20 and 32 $R_a$.

30. The process of claim 28 wherein said dielectric layer is either a carbon-doped silica glass layer or a fluorosilicate glass (FSG) layer.

31. The process of claim 30 wherein said barrier layer is selected from the group consisting of a silicon nitride layer or a silicon carbide layer.

32. The process of claim 30 wherein said interior surface of said first chamber has a roughness of between 100 and 140 $R_a$.

33. An integrated damascene trench etch process performed in a multichamber substrate processing system having first and second chambers, said process comprising:

transferring a substrate having formed thereon in a downward direction a patterned photoresist mask, a carbon-doped silica glass dielectric layer and a stop layer into said first chamber, wherein said photoresist mask is patterned according to a wiring pattern wherein an interior surface of said first chamber that is prone to polymer accumulation has a roughness of at least 100 $R_a$, etching said dielectric layer in said first chamber to transfer said wiring pattern into said dielectric layer, wherein said etching process is run in a mode that encourages polymer formation on an interior surface of said first chamber and wherein said etching process is endpointed using interferometric signals detected by an optical sensor during said etching process;

transferring the substrate from said first chamber to said second chamber under vacuum conditions, wherein an interior surface of said second chamber that is prone to polymer accumulation has a roughness less than that of said first chamber interior surface; and in said second chamber, stripping the photoresist mask and subsequently etching said stop layer prior to exposing said substrate to an ambient, wherein said stop layer etching process is run in a mode that discourages polymer formation on an interior surface of said second chamber.

34. The process of claim 33 wherein the roughness of the interior surface of the second chamber is less than 32 $R_a$.

35. The process of claim 34 wherein said interior surface of said first chamber has a roughness between about 100 and 200 $R_a$.

36. The process of claim 34 wherein said interior surface of said first chamber has a roughness of between 100 and 140 $R_a$.

37. The method of claim 34 wherein the interior surfaces of said first and second chambers are each aluminum oxide liners formed over an aluminum wall.

38. The process of claim 33 wherein said stop layer is a silica carbide layer and the step that etches said dielectric layer exposes the dielectric layer to a plasma formed from an etchant gas comprising $C_4F_6$ at an end portion of the etching step.

39. An integrated etch process performed in a multichamber substrate processing system having first and second chambers, said process comprising:

transferring a substrate having formed thereon in a downward direction a patterned photoresist mask, a dielectric layer and a barrier layer into said first chamber;

etching said dielectric layer in said first chamber to transfer said pattern into said dielectric layer, wherein during said etching process an interior surface of said first chamber is cooled to a first temperature to encourage polymer formation on said interior surface of said first chamber;

transferring the substrate from said first chamber to said second chamber under vacuum conditions; and in said second chamber, stripping the photoresist mask and subsequently etching said barrier layer prior to exposing said substrate to an ambient, wherein during said barrier layer etching a temperature of an interior surface of said second chamber is controlled to a second temperature to discourage polymer formation on said interior surface of said second chamber.

40. The process of claim 39 wherein said first temperature is less than said second temperature.

41. The process of claim 40 wherein said first and second interior surfaces of said first and second chambers are both interior surfaces of a chamber wall.

42. The process of claim 41 wherein the first temperature is less than the second temperature.

43. The process of claim 42 wherein said dielectric layer is either a carbon-doped silica glass layer or a fluorosilicate glass (FSG) layer.

44. The process of claim 42 wherein said barrier layer is selected from the group consisting of a silicon nitride layer or a silicon carbide layer.

45. The process of claim 44 wherein said dielectric layer is etched in said first chamber with a plasma formed from a fluorocarbon gas.

46. The process of claim 45 wherein said fluorocarbon gas comprises $C_4F_6$.

* * * * *